(12) United States Patent
Ishii

(10) Patent No.: US 8,089,068 B2
(45) Date of Patent: Jan. 3, 2012

(54) THIN-FILM TRANSISTOR PANEL HAVING STRUCTURE THAT SUPPRESSES CHARACTERISTIC SHIFTS AND METHOD FOR MANUFACTURING THE SAME

(75) Inventor: Hiromitsu Ishii, Mitaka (JP)

(73) Assignee: Casio Computer Co., Ltd., Tokyo (JP)

( * ) Notice: Subject to any disclaimer, the term of this patent is extended or adjusted under 35 U.S.C. 154(b) by 538 days.

(21) Appl. No.: 11/582,886

(22) Filed: Oct. 18, 2006

(65) Prior Publication Data

US 2007/0090422 A1    Apr. 26, 2007

(30) Foreign Application Priority Data

Oct. 20, 2005    (JP) .................................. 2005-305140

(51) Int. Cl.
*H01L 29/04* (2006.01)
*H01L 29/10* (2006.01)
(52) U.S. Cl. ......................................... 257/59; 257/72
(58) Field of Classification Search .................... 257/59, 257/72, E27.111; 428/469
See application file for complete search history.

(56) References Cited

U.S. PATENT DOCUMENTS

| | | | |
|---|---|---|---|
| 6,870,187 B2 | 3/2005 | Chung | |
| 6,893,908 B2 | 5/2005 | You et al. | |
| 2002/0061410 A1* | 5/2002 | Sasaki et al. ................... | 428/469 |

FOREIGN PATENT DOCUMENTS

| | | |
|---|---|---|
| CN | 1388574 A | 1/2003 |
| CN | 1540717 A | 10/2004 |
| JP | 10-161564 A | 6/1998 |
| JP | 11-354810 A | 12/1999 |
| JP | 2000-075324 A | 3/2000 |
| JP | 2004-302314 A | 10/2004 |
| JP | 2005-93460 A | 4/2005 |
| KR | 2001-0048150 A | 6/2001 |
| KR | 2004-0064466 A | 7/2004 |

OTHER PUBLICATIONS

Chinese Office Action dated Feb. 20, 2009 (7 pages), and English translation thereof (6 pages) issued in counterpart Chinese Application No. 200610171869.8.
Chinese Office Action dated Nov. 27, 2009 and English translation thereof issued in a counterpart Chinese Application No. 2008102125665.
Japanese Office Action dated Apr. 13, 2010 and English translation thereof in counterpart Japanese Application No. 2005-305140.
Chinese Office Action dated Nov. 26, 2010 (and English translation thereof) in counterpart Chinese Application No. 200910168653.X.

* cited by examiner

*Primary Examiner* — Hung Vu
(74) *Attorney, Agent, or Firm* — Holtz, Holtz, Goodman & Chick, PC

(57) ABSTRACT

A thin-film transistor panel includes a substrate, and a thin-film transistor formed on the substrate. The transistor includes a gate electrode, a gate insulating film, a semiconductor thin film, first and second ohmic contact layers formed on the semiconductor thin film, and source and drain electrodes which are respectively formed on the first and second ohmic contact layers. The semiconductor thin film includes a channel area between the source electrode and the drain electrode. A pixel electrode is connected to the source electrode of the thin-film transistor. First and second conductive coating films are provided on the source and drain electrodes, respectively, and formed of the same material as the pixel electrode. The first conductive coating film is wider than the source electrode, and the second conductive coating film is wider than the drain electrode.

27 Claims, 18 Drawing Sheets

US 8,089,068 B2

THIN-FILM TRANSISTOR PANEL HAVING STRUCTURE THAT SUPPRESSES CHARACTERISTIC SHIFTS AND METHOD FOR MANUFACTURING THE SAME

CROSS-REFERENCE TO RELATED APPLICATIONS

This application is based upon and claims the benefit of priority from prior Japanese Patent Application No. 2005-305140, filed Oct. 20, 2005, the entire contents of which are incorporated herein by reference.

BACKGROUND OF THE INVENTION

1. Field of the Invention

The present invention relates to a thin-film transistor panel having a structure that suppresses characteristic shifts and to a method for manufacturing the thin-film transistor panel.

2. Description of the Related Art

A thin-film transistor panel is used in, for example, an active matrix type liquid crystal display device. The thin film transistor panel has a plurality of pixel electrodes and switching thin-film transistors respectively connected to the pixel electrode. An opposite electrode panel having color filters and an opposite electrode is placed so that a liquid crystal is sandwiched between the opposite electrode panel and the thin-film transistor panel. A display voltage corresponding to the display pixel is applied to between each of the pixel electrodes and the opposite electrode. This changes the transmittance of the liquid crystal to allow an image to be viewed. Jpn. Pat. Appln. KOKAI Publication No. 2005-93460 describes an exemplary structure of a thin-film transistor of the thin-film transistor panel. The thin-film transistor described in the JP 2005-93460 has a gate electrode provided on a top surface of a glass substrate and a gate insulating film provided on top surfaces of the gate electrode and substrate. A semiconductor thin film made of intrinsic amorphous silicon is provided on a top surface part of the gate insulating film which corresponds to the gate electrode. A channel protective film made of silicon nitride is provided in a predetermined area of a top surface of the semiconductor thin film. Ohmic contact layers made of n-type amorphous silicon are provided on the opposite sides of the top surface of the channel protective film and on the top surface of the semiconductor thin film. Source and drain electrodes are formed on top surfaces of the respective ohmic contact layers. An overcoat film made of silicon nitride is provided on the source and drain electrodes.

In the above conventional thin-film transistor, the source and drain electrodes are wider than each ohmic contact layer in an area provided directly on the semiconductor thin film. Further, each ohmic contact layer in the area provided directly on the semiconductor thin film is entirely covered with the source and drain electrodes. Thus, even though the overcoat film made of silicon nitride is formed on the source and drain electrodes by a plasma CVD process, the surface of each ohmic contact layer in the area provided directly on the semiconductor thin film is not damaged by plasma. This in turn makes it possible to avoid shifting a Vg (gate voltage)-Id (drain current) characteristic to a minus side.

However, in the above conventional thin-film transistor, the source and drain electrodes are wider than each ohmic contact layer in the area provided directly on the semiconductor thin film. Consequently, a photolithography process for forming the source and drain electrodes is different from a photolithography process for forming the ohmic contact layers. This increases the number of photolithographic steps.

BRIEF SUMMARY OF THE INVENTION

An object of the present invention is thus to provide a thin-film transistor panel which can avoid shifting the Vg-Id characteristic to the minus side and which can prevent an increase in the number of photolithography steps.

To accomplish this object, a first aspect of the present invention provides a thin-film transistor panel which includes a substrate, and a thin-film transistor formed on the substrate. The transistor includes a gate electrode, a gate insulating film, a semiconductor thin film, first and second ohmic contact layers formed on the semiconductor thin film, and source and drain electrodes which are respectively formed on the first and second ohmic contact layers. The semiconductor thin film includes a channel area between the source electrode and the drain electrode. A pixel electrode is connected to the source electrode of the thin-film transistor. First and second conductive coating films are provided on the source and drain electrodes, respectively, and formed of the same material as the pixel electrode. The first conductive coating film is wider than the source electrode, and the second conductive coating film is wider than the drain electrode.

A second aspect of the present invention provides a method for manufacturing a thin-film transistor including forming a thin film transistor on a substrate, such that the thin film transistor includes a semiconductor thin film provided above a gate electrode via a gate insulating film, a pair of ohmic contact layers provided on the semiconductor thin film, and a source and drain electrodes provided on the ohmic contact layers. A pixel electrode forming film is deposited on the thin-film transistor. And the pixel electrode forming film is etched to form a pixel electrode connected to the source electrode of the thin-film transistor and a conductive coating film provided on at least one of the source and drain electrodes, such that the conductive coating film is wider than the at least one of the source and drain electrodes and entirely covering the at least one of the source and drain electrodes.

According to the present invention, the conductive covering film which is wider than the source or drain electrode entirely covers the part of the source or drain electrode which is outside the channel area. This makes it possible to avoid shifting the Vg-Id characteristic to the minus side. Further, the conductive covering film is formed of the same material as that of the pixel electrode. This makes it possible to prevent an increase in the number of photolithography steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are diagrams illustrating an initial step in an exemplary method for manufacturing a thin-film transistor panel according to the first embodiment, wherein FIG. 3A is a perspective plan view showing a part of the panel of FIG. 1, and FIG. 3B is a sectional view taken along $III_B$-$III_B$ in FIG. 3A;

DETAILED DESCRIPTION OF THE INVENTION

First Embodiment

Figure 1:
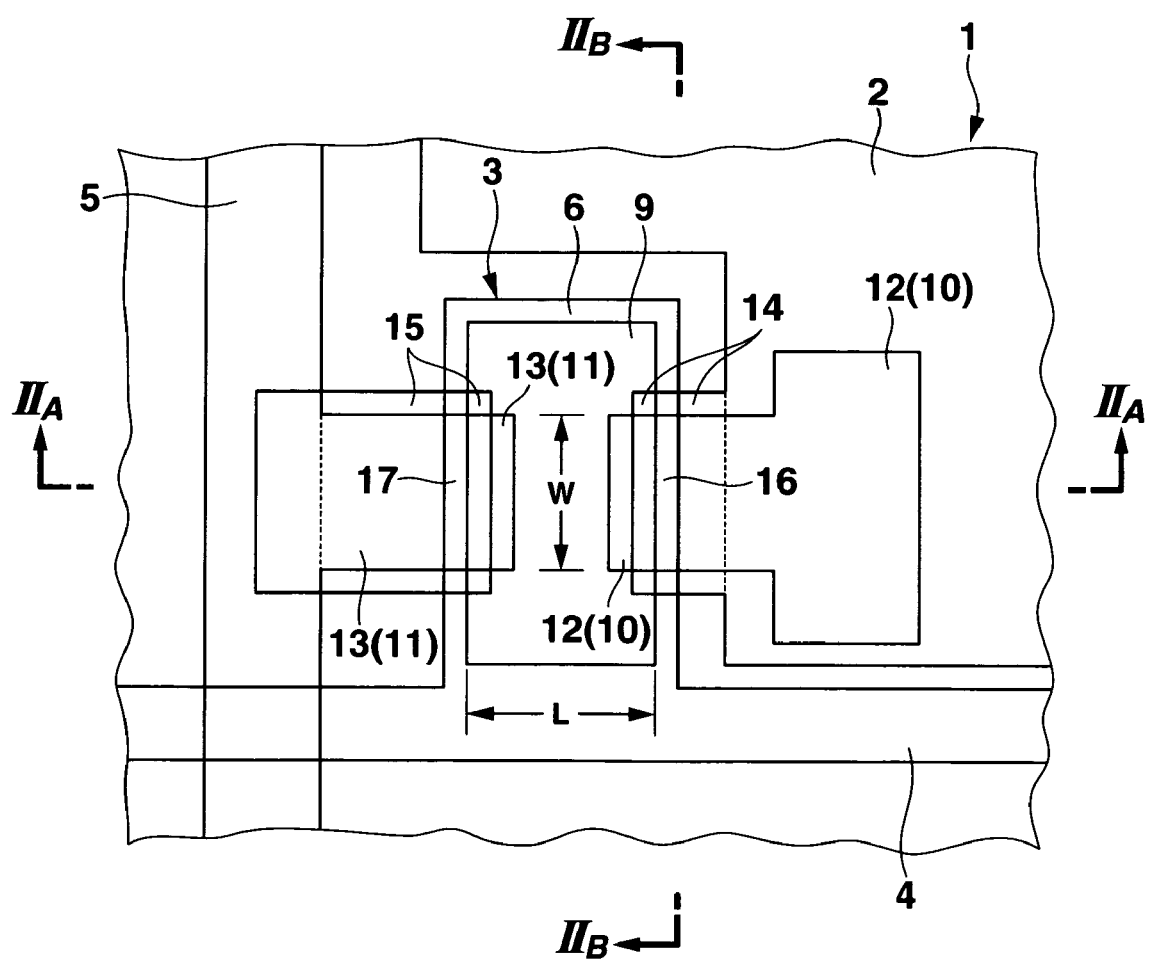
FIG. 1 is a perspective plan view of a part of a thin-film transistor panel according to a first embodiment of the present invention.
Figure 2A:
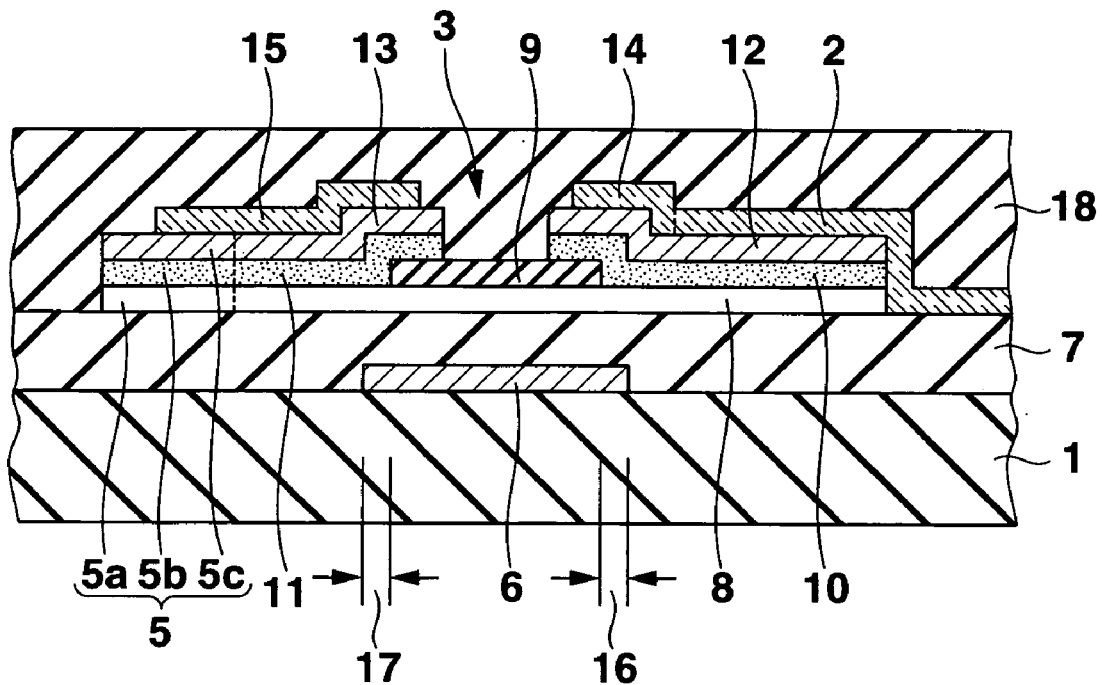
FIG. 2A is a sectional view taken along line $II_A$-$II_A$ in FIG. 1.
Figure 2B:
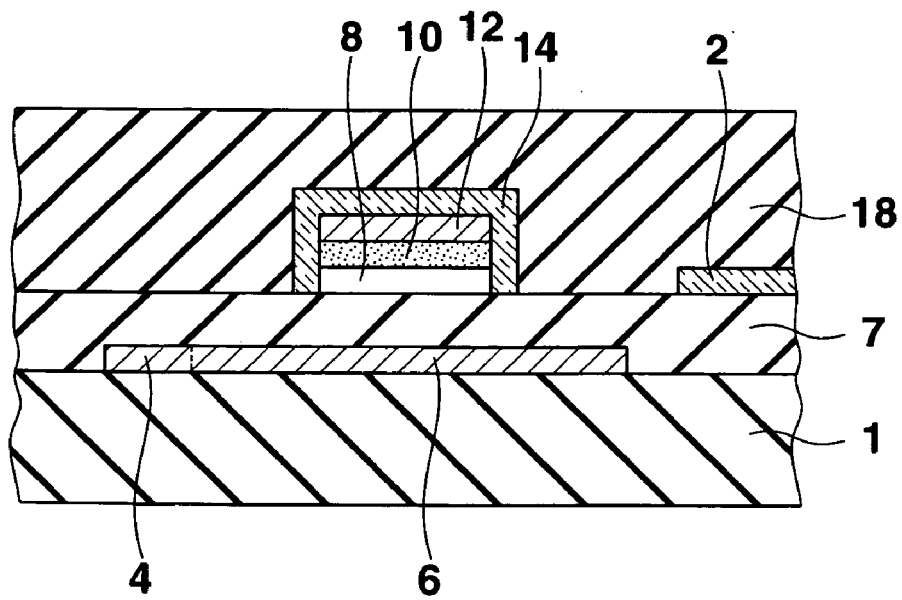
FIG. 2B is a sectional view taken along line $II_B$-$II_B$ in FIG. 1.

FIG. 1 is a perspective plan view of a part of a thin-film transistor panel according to a first embodiment of the present invention. FIG. 2A is a sectional view taken along line $II_A$-$II_A$ in FIG. 1, and FIG. 2B is a sectional view taken along line $II_B$-$II_B$ in FIG. 1. For clarity, FIG. 1 omits overcoat film 18 (described later), which is shown in FIGS. 2A and 2B. Dashed lines are used in the drawings to indicate virtual boundaries between elements. This thin-film transistor panel includes a glass substrate 1. The following are provided on a top surface of the glass substrate 1: a plurality of pixel electrodes 2 arranged in a matrix, thin-film transistors 3 (only one is shown in FIG. 1) each connected to a corresponding pixel electrode 2, scan lines 4 arranged in respective rows to supply a scan signal (gate voltage) to a corresponding thin-film transistor 3, and data lines 5 arranged in respective columns to supply a data signal to a corresponding thin-film transistor 3.

A plurality of gate electrodes 6 are provided in predetermined areas on the glass substrate. Each of the gate electrodes 6 is made of chromium, aluminum containing metal, or the like and is electrically connected to a corresponding scan line 4. A gate insulating film 7 made of silicon nitride is provided on top surfaces of the gate electrodes 6, scan lines 4, and glass substrate 1. A semiconductor thin film 8 made of intrinsic amorphous silicon is provided above the corresponding gate electrode 6 in a predetermined area of the top surface of the gate insulating film 7.

A channel protective film 9 is provided on a top surface of the semiconductor thin film 8, but is not provided on the opposite sides of the semiconductor thin film 8 (see FIGS. 1 and 2A). In this case, the channel protective film 9 has dimensions, or size, smaller than the dimensions or size of the gate electrode 6 in width and longitudinal directions thereof. The channel protective film 9 is provided on a top surface of the semiconductor thin film 8 above a central portion of the gate electrode 6. A pair of ohmic contact layers 10 and 11 are provided on the opposite sides of a top surface of the channel protective film 9 in a channel length L direction (direction L in FIG. 1) and on the top surface of the semiconductor thin film 8 on the opposite sides of the channel protective film 9. A source electrode 12 and a drain electrode 13 both made of chromium, aluminum containing metal, or the like, are provided on top surfaces of the ohmic contact layers 10 and 11, respectively.

In this case, the entire peripheral end or side surfaces of the ohmic layers 10 and 11 are flush with peripheral end or side surfaces of the source electrode 12 and drain electrode 13. That is to say, the ohmic contact layers 10 and 11 are provided only under the source electrode 12 and drain electrode 13, respectively, as shown in FIGS. 2A and 2B. Peripheral end or side surfaces of the semiconductor thin film 8 are also flush with peripheral end or side surfaces of the pair of ohmic contact layers 10 and 11. One of the side ends of the ohmic contact layer 10 and the opposite side end of the ohmic contact layer 11 extend onto opposite side end portions of the channel protection film 9. One of the side ends of the source electrode 12 and the opposite side end of the drain electrode 13 also extend together with the ohmic contact layers 10, 11 over the opposite side end portions of the channel protection film 9.

The data line 5 is provided in a predetermined area of a top surface of the gate insulating film 7.

The data line 5 has a three-layer structure including an intrinsic amorphous silicon layer 5a, an n-type amorphous silicon layer 5b, and a metal layer 5c made of chromium, aluminum containing metal, or the like, which are arranged in this order from the bottom to top of the data line 5. The intrinsic amorphous silicon layer 5a, n-type amorphous silicon layer 5b, and metal layer 5c are respectively connected to or arranged contiguously to the semiconductor thin film 8, ohmic contact layer 11, and drain electrode 13, in the area in which the drain electrode 13 is formed.

One conductive covering film 14 which made of ITO, for example, is provided on a part of the top surface of the source electrode 12 which is close to the protective film 9 and on the top surfaces of the channel protective film 9 and gate insulating film 7 on the opposite sides of source electrode 12 in a channel width W direction (direction W in FIG. 1). Another conductive covering film 15 is provided on top surfaces of the drain electrode 13 and the metal layer 5c of the nearby data line 5 and on top surfaces of the channel protective film 9 and gate insulating film 7 on the opposite sides of the drain electrode 13 in the channel width W direction. In this case, the conductive coating films 14 and 15 have a width that is larger than a width of the source electrode 12 and drain electrode 13, in the channel width W direction. The tips (width-wise inner ends) of the source electrode 12 and drain electrode 13 extending onto the channel protective film 9 are not covered with the conductive coating films 14 and 15. The conductive coating film 15 extends from the drain electrode 13 over a part of the data line (drain wiring) 5, connected to the drain electrode 13.

Ohmic contact areas 16 and 17 are formed by the portions of the semiconductor thin film 8 and ohmic contact layers 10 and 11 which are overlapped and located outside a channel area and above parts of the gate electrode 6 that are located outside of the channel protective film 9. As shown in FIG. 2B, the conductive coating film 14 entirely covers the opposite end surfaces, in the channel width W direction, of the semiconductor thin film 8, ohmic contact layer 10, and source electrode 12 in the ohmic contact area 16. Although not shown, in a similar manner to that shown in FIG. 2B, the conductive coating film 15 entirely covers the opposite end surfaces, in the channel width W direction, of the semiconductor thin film 8, other ohmic contact layer 11, and drain electrode 13 in the other ohmic contact area 17.

A channel protective film-type thin-film transistor 3 of a bottom gate structure includes the gate electrode 6, gate insulating film 7, semiconductor thin film 8, channel protective film 9, the pair of ohmic contact layers 10 and 11, source electrode 12, drain electrode 13, and the pair of conductive covering films 14 and 15.

The pixel electrode 2 is made of ITO or the like. The pixel electrode is provided on the top surface of the source electrode 12 except for the end portion thereof near the drain electrode 13. The pixel electrode is extended onto the top surface of the gate insulating film 7. In this case, the conductive coating film 14 is integrally formed with the pixel electrode 2 so as to lie contiguously to the pixel electrode 2. An overcoat film 18 made of silicon nitride is provided on the top surfaces of the gate insulating film 7, the pixel electrodes 2 and thin film transistors 3.

In the thin-film transistor 3 in this thin-film transistor panel, the ohmic contact layer 10 and source electrode 12 are provide on the right side of the gate electrode 6 in a direction parallel to the scan line 4, as shown in FIG. 1. The ohmic contact layer 11 and drain electrode 13 are provided on the opposite side, that is, the left side of the gate electrode 6. In this case, the channel length L of the semiconductor thin film 8 corresponds to the length of the channel protective film 9 in the length direction of the channel. The channel width W corresponds to the length of each of the ohmic contact layers 10 and 11 in the width direction of the channel. The opposite end surfaces of each of the conductive coating films 14 and 15 extend to the inside of the channel area, that is, over the channel protective film 9. However, one end surface of the conductive coating film 14 does not reach the corresponding end surface of the source electrode 12. Also, one end surface of the conductive coating film 15 which is opposite the end surface of the conductive coating film 14 does not reach the corresponding end surface of the drain electrode 13 (see FIG. 1). Alternately, the end surfaces of the conductive coating fins 14 and 15 may be flush with the corresponding end surfaces of the source electrode 12 and drain electrode 13, respectively, or may extend toward the center of the channel protective film 9. However, the conductive coating films 14 and 15 must be electrically insulated from each other. Accordingly, when the end surfaces of the conductive coating films 14 and 15 are flush with the corresponding end surfaces of the source electrode 12 and drain electrode 13, respectively, or extend to the center of the channel protective film 9, a misalignment of these members is likely to short circuit the conductive coating films 14 and 15. Consequently, to obtain fine display elements, the opposite end surfaces of the conductive coating films 14 and 15 are desirably designed so as not to reach the corresponding end surfaces of the source electrode 12 and drain electrode 13, respectively.

In the thin-film transistor 3, the opposite end surfaces, in the channel width W direction, of the semiconductor thin film 8 and ohmic contact layers 10 and 11 in the ohmic contact areas 16 and 17 are entirely covered with the conductive coating films 14 and 15, which are wider than the source electrode 12 and drain electrode 13 in the channel width W direction. The conductive coating films 14 and 15 are electrically connected to the source electrode 12 and drain electrode 13, respectively, and thus have the same potentials as the source and drain electrodes 12 and 13, respectively.

As a result, it has been confirmed that the semiconductor thin film 8 and ohmic contact layers 10 and 11 in the ohmic contact areas 16 and 17, including their side surfaces in the channel width W direction, are subjected to a vertical electric field which is perpendicular to a plane of the glass substrate 1 and which is formed between the gate electrode 6 and the conductive coating films 14 and 15, which have the same potentials as the source electrode 12 and drain electrode 13. This makes it possible to avoid shifting the Vg-Id characteristic to the minus side. In this case, a gate-on-voltage and a gate-off-voltage which are applied to the gate electrode 6 desirably have the same absolute value.

Figure 3A:
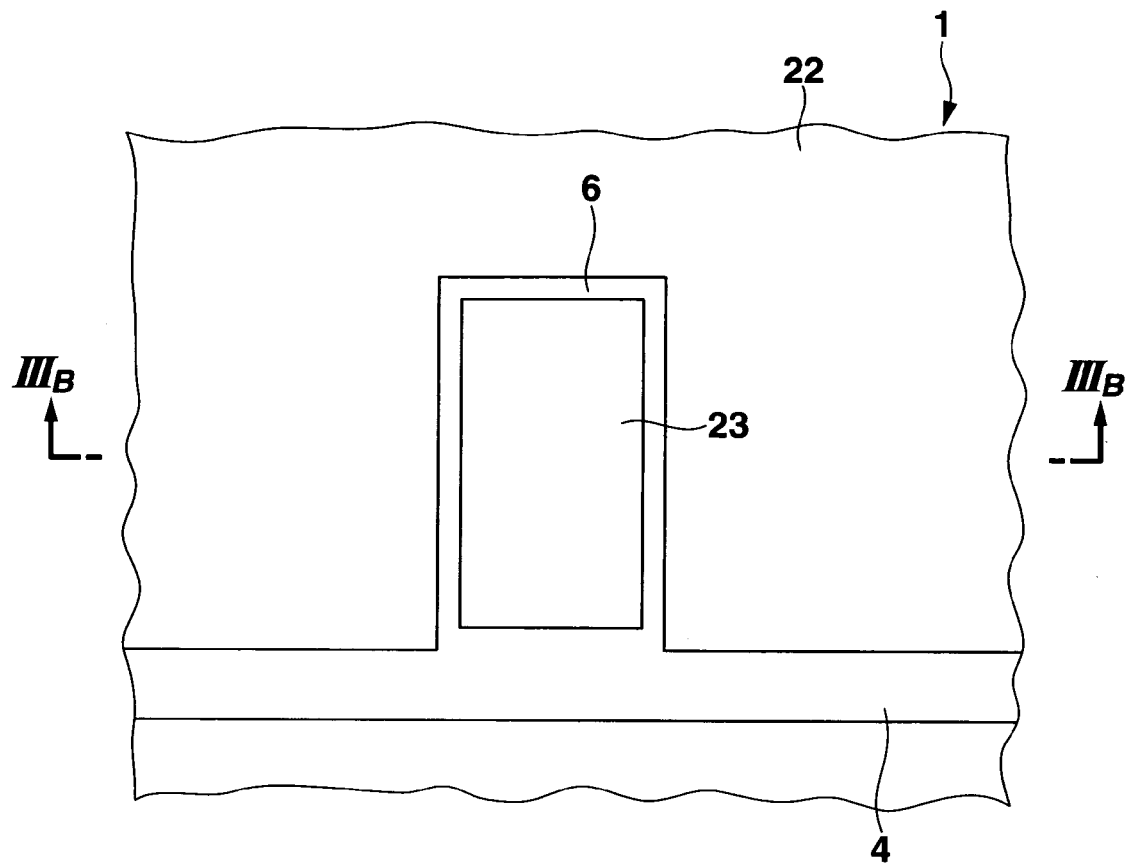
Figure 3B:
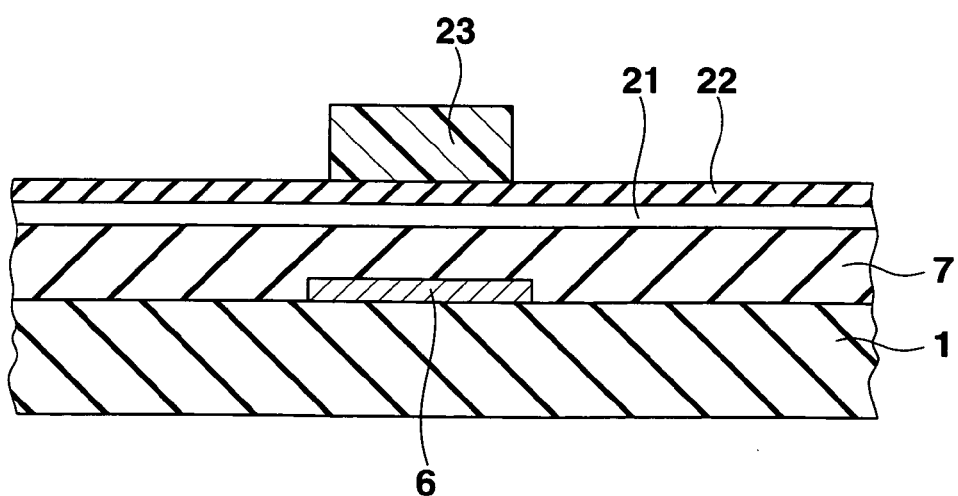

Now, an exemplary method for manufacturing the above thin film transistor panel will be described. First, as shown in FIGS. 3A and 3B, a metal film formed of chromium or the like by a sputtering process is patterned in a predetermined area of the top surface of a glass substrate 1 by a photolithographic process. Gate electrodes 6 and scan lines 4 are thus formed. Then, a gate insulating film 7 which is made of silicon nitride, an intrinsic amorphous silicon film 21, and a silicon nitride film 22 are deposited on the top surfaces of the gate electrodes 6, scan lines 4, and glass substrate 1 by a CVD process so as to sequentially lie on top of one another.

Figure 4A:
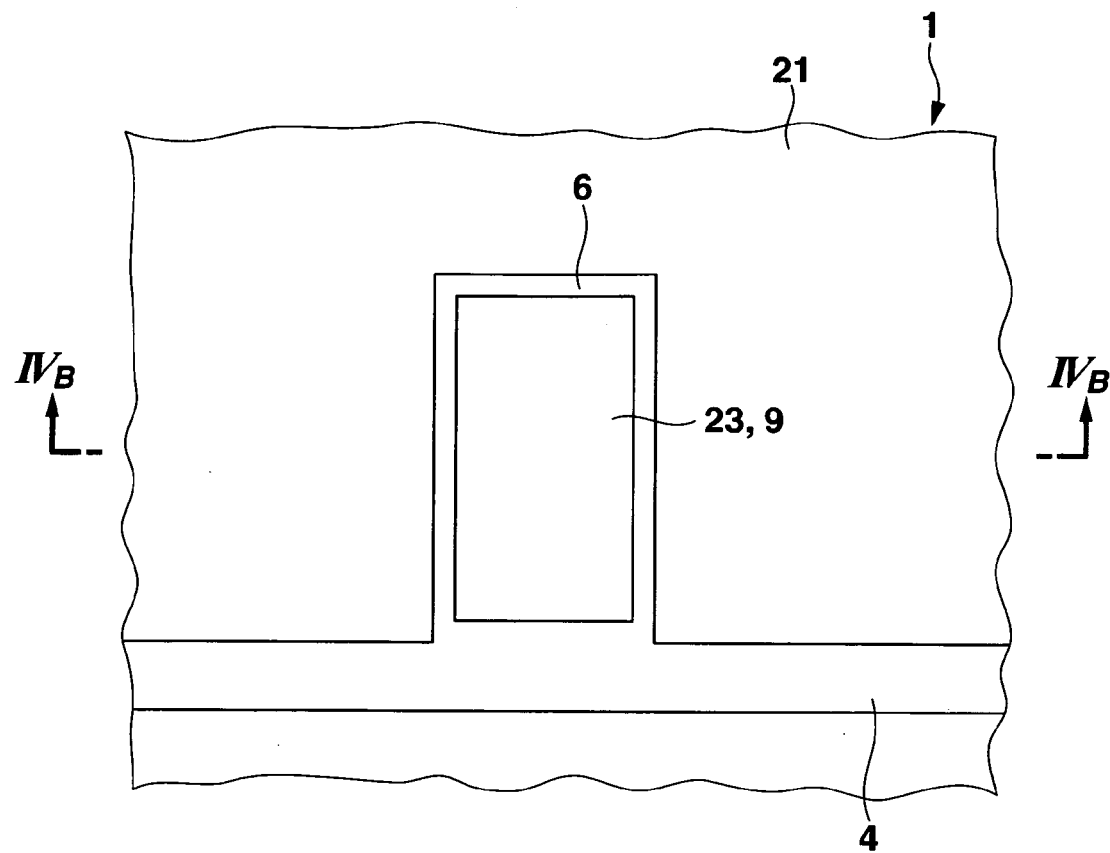
FIGS. 4A and 4B are a perspective plan view of a step following FIG. 3A and a sectional view taken along line $IV_B$-$IV_B$ in FIG. 4A, respectively.
Figure 4B:
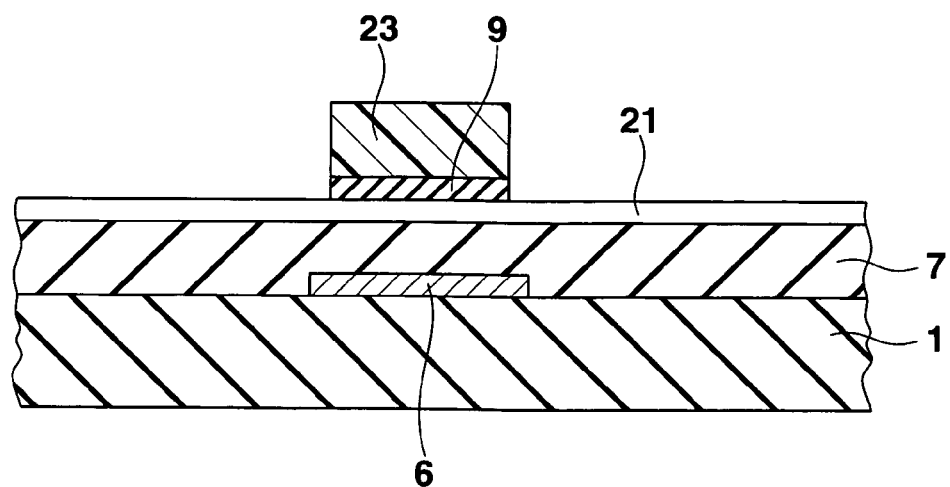

Then, a resist film is coated on the top surface of the silicon nitride film 22. Parts of the resist film which have been coated on the area in which channel protective films are to be formed are patterned and left by the photolithographic process, to form island-like resist films 23. Then, the resist film 23 is used as a mask to etch the silicon nitride film 22 to form a channel protective film 9 under the resist film 23 as shown in FIGS. 4A and 4B. The resist film 23 is then removed to expose the top surface of the channel protective film 9.

Figure 5A:
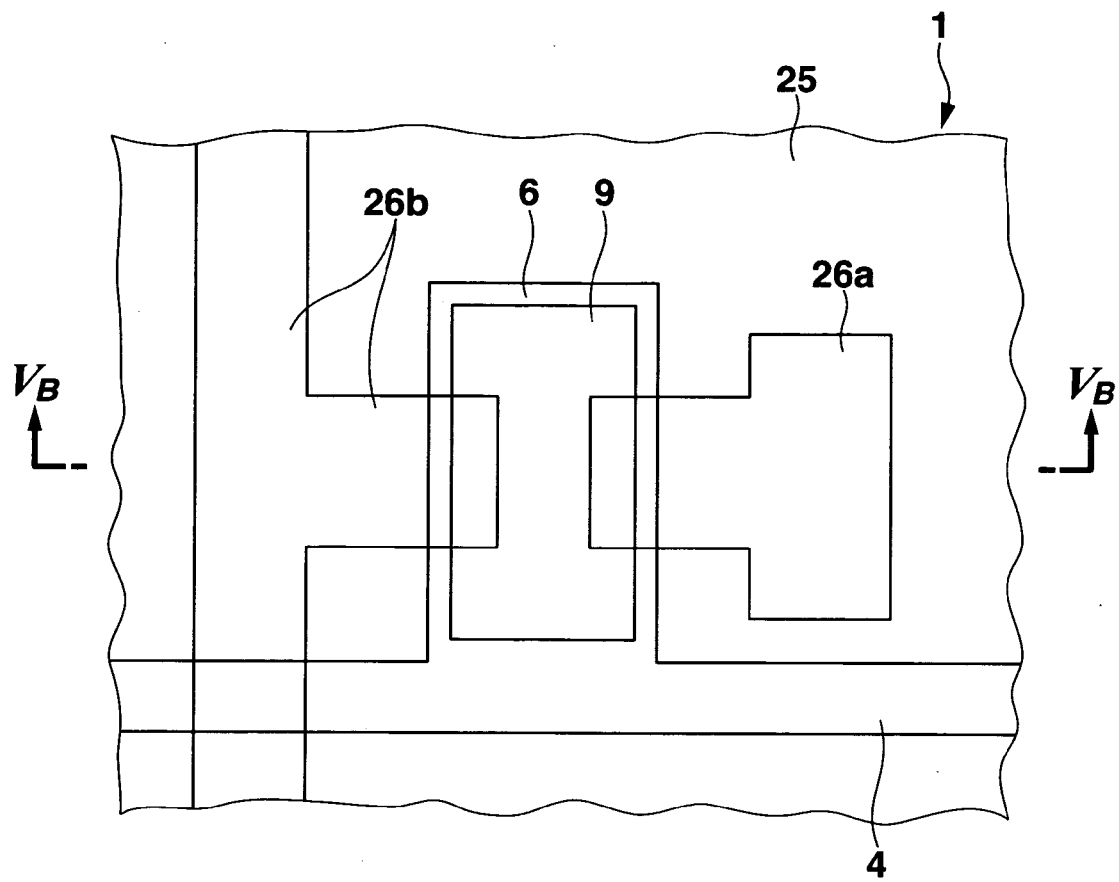
FIGS. 5A and 5B are a perspective plan view of a step following FIG. 4A and a sectional view taken along line $V_B$-$V_B$ in FIG. 5A, respectively.
Figure 5B:
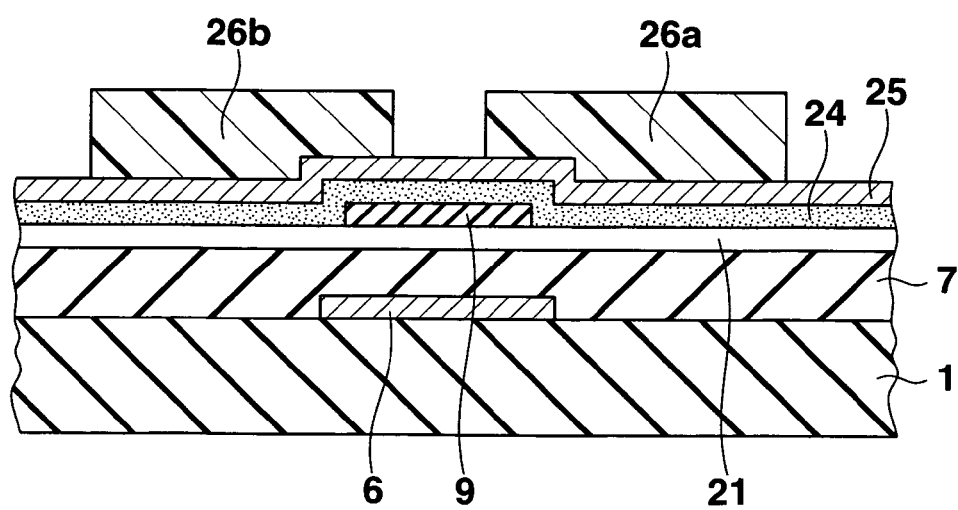

Then, as shown in FIGS. 5A and 5B, an n-type amorphous silicon film 24 is deposited on the top surfaces of the channel protective films 9 and intrinsic amorphous silicon film 21 by a CVD process. A metal film 25 made of chromium or the like is deposited on the amorphous silicon film 24 by a sputtering process. A resist film is then coated on the top surface of the metal film 25. Predetermined areas of the resist film are patterned by a photolithographic process to form a plurality of pairs of resist films 26a and 26b. In this case, the resist film 26a is to form the source electrode 12, and the resist film 26b is to form the drain electrode 13 and the data line 5.

Figure 6A:
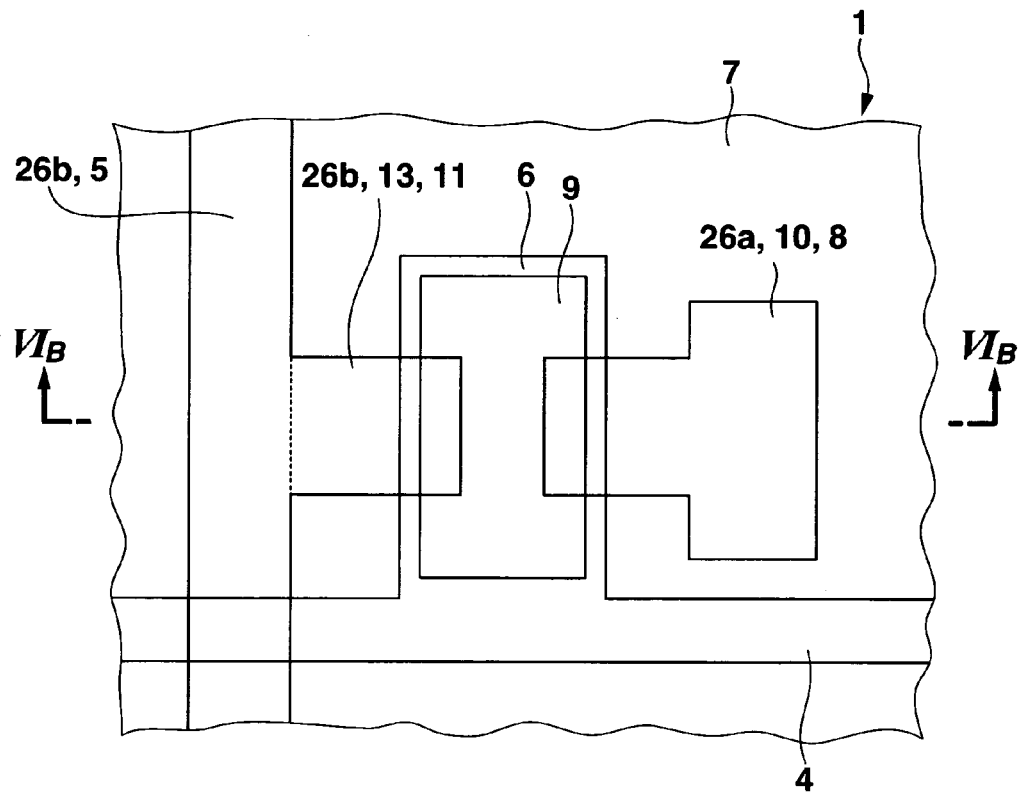
FIGS. 6A and 6B are a perspective plan view of a step following FIG. 5A and a sectional view taken along line $VI_B$-$VI_B$ in FIG. 6A, respectively.
Figure 6B:
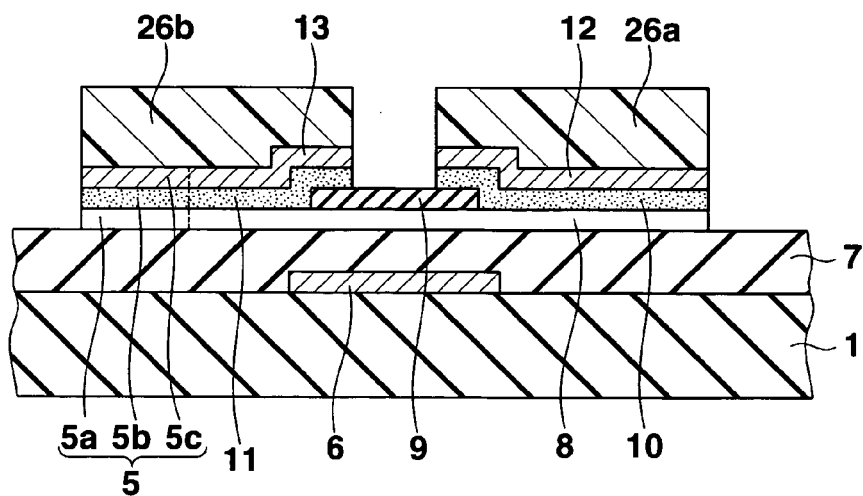

Then, the resist films 26a and 26b (including the channel protective film 9) are used as masks to sequentially etch the metal film 25, n-type amorphous silicon film 24, and intrinsic amorphous silicon film 21. The configuration as shown in FIGS. 6A and 6B is thus obtained. In this configuration, the source electrode 12 and ohmic contact layer 10 are formed under the resist film 26a. The drain electrode 13 and ohmic contact layer 11 are formed under the other resist film 26b. The semiconductor film 8 is formed under both ohmic contact layers 10 and 11 and channel protective layer 9. The data line 5 having a three-layer structure formed of the metal film 5c, n-type amorphous silicon film 5b, and intrinsic amorphous silicon film 5a is formed under the resist film 26b.

Then, the resist films 26a and 26b are removed. In this case, the resist films 26a and 26b (including the channel protective film 9) have been used as masks to sequentially etch the metal film 25, n-type amorphous silicon film 24, and intrinsic amorphous silicon film 21 to form a source electrode 12, a drain electrode 13, a pair of ohmic contact layers 10 and 11, and a semiconductor film 8. This enables a reduction in photolithographic steps compared to a process in which the source electrode 12 and drain electrode 13 are formed in a photolithographic step different from a photolithographic step for forming the pair of ohmic contact layers 10 and 11 and semiconductor thin film 8.

Alternatively, after the formation of the source electrode 12 and drain electrode 13, the resist films 26a and 26b may be removed. The source and drain electrodes 12, 13 (including the channel protective film 9) may then be used as masks to sequentially etch the n-type amorphous silicon film 24 and intrinsic amorphous silicon film 21 to form a pair of ohmic contact layers 10 and 11 and a semiconductor thin film 8.

Figure 7A:
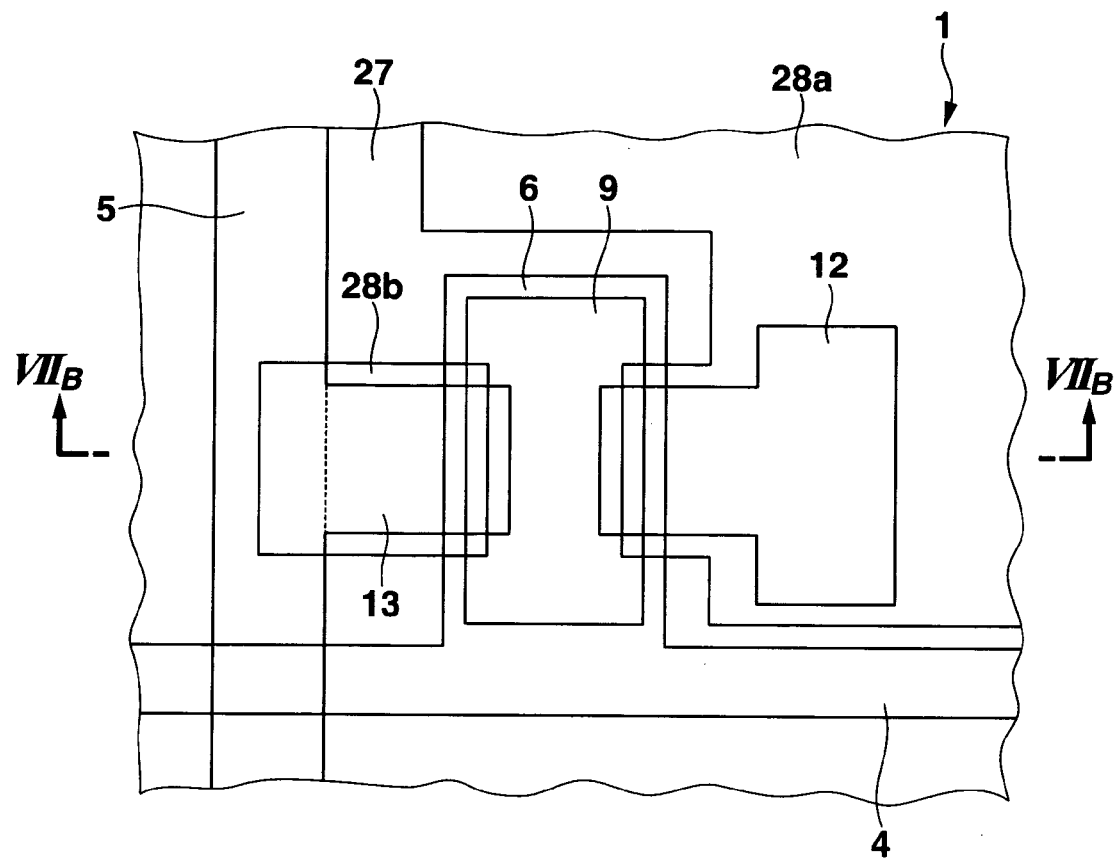
FIGS. 7A and 7B are a perspective plan view of a step following FIG. 6A and a sectional view taken along line $VII_B$-$VII_B$ in FIG. 7A, respectively.
Figure 7B:
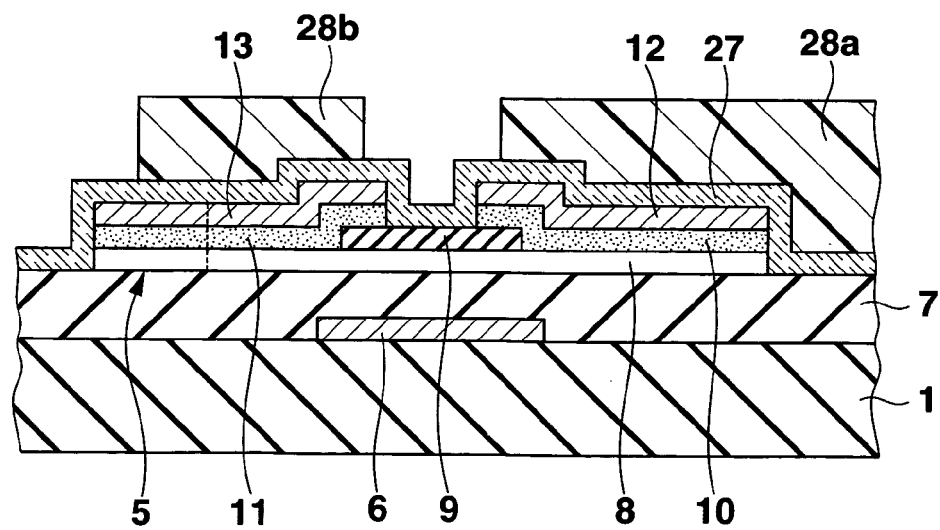

Then, as shown in FIGS. 7A and 7B, a pixel electrode forming film 27 made of ITO is formed on the top surface of the gate insulating film 7, source electrodes 12, drain electrodes 13, and data lines 5. A resist film is then coated on the top surface of the pixel electrode forming film 27. The resist film is then patterned by a photolithographic process to form a plurality of pairs of resist films 28a and 28b. In this case, the resist film 28a is to form the pixel electrode 2 and the conductive coating film 14. The resist film 28b is to form the conductive coating film 15.

Figure 8A:
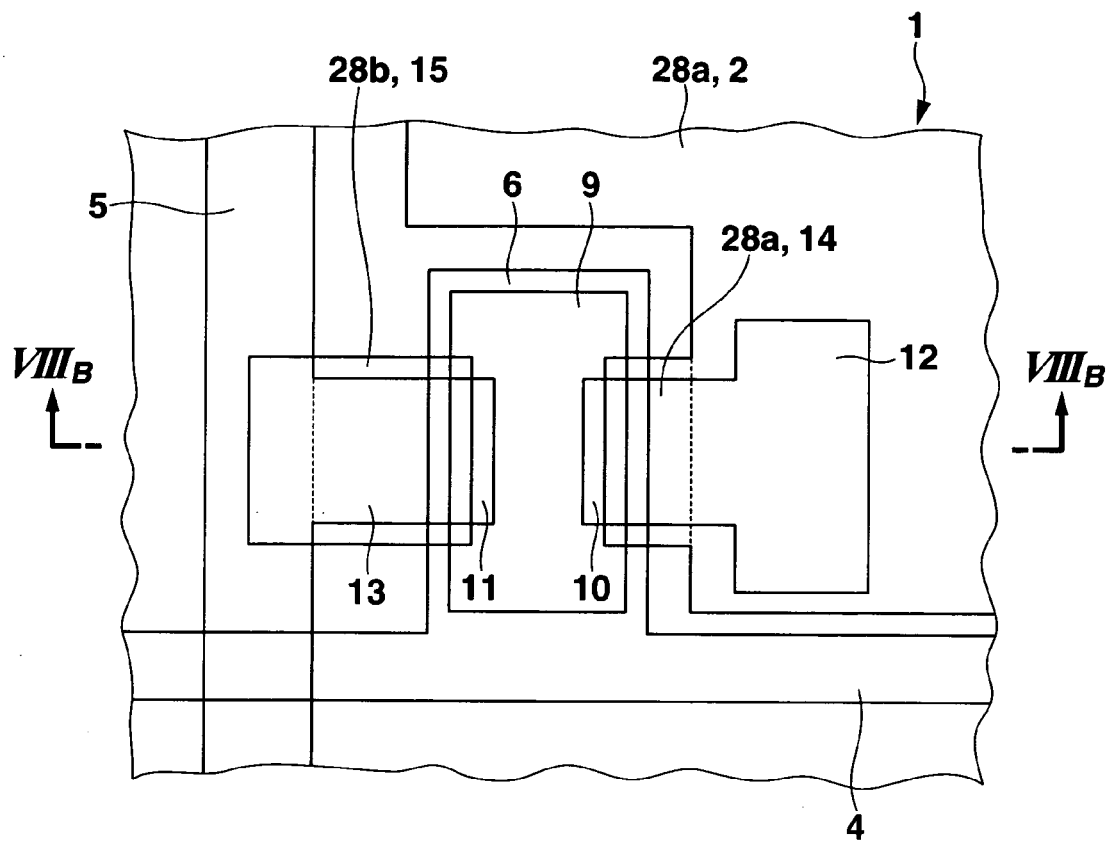
FIGS. 8A and 8B are a perspective plan view of a step following FIG. 7A and a sectional view taken along line $VIII_B$-$VIII_B$ in FIG. 8A, respectively.
Figure 8B:
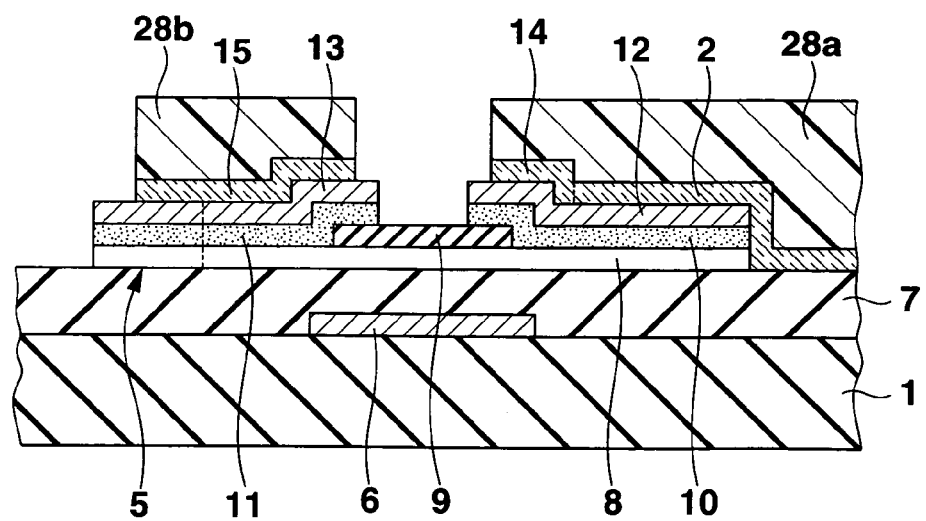

Then, the resist films 28a and 28b are used as masks to etch the pixel electrode forming film 27 to obtain the configuration shown in FIGS. 8A and 8B. In this configuration, the pixel electrode 2 and conductive coating film 14 are formed under the resist film 28a. The other conductive coating film 15 is formed under the other resist film 28b. Thus, the pair of conductive coating films 14 and 15 are formed using the same material as the pixel electrode 2 simultaneously with the formation of the pixel electrode 2. This makes it possible to avoid an increase in the number of photolithography steps.

Under the above conditions, the conductive coating film 14 entirely covers the opposite end surfaces, in the channel width W direction, of each of the source electrode 12, ohmic contact layer 10, and semiconductor thin film 8, which are located below the conductive coating film 14. The other conductive coating film 15 entirely covers the opposite end surfaces, in the channel width W direction, of each of the drain electrode 13, ohmic contact layer 11, and semiconductor thin film 8, which are located below the conductive coating film 15.

Then, both resist films 28a and 28b are removed. As shown in FIGS. 2A and 2B, an overcoat film 18 made of silicon nitride is deposited on the top surface of the gate insulating films 7 and pixel electrodes 2. A thin-film transistor panel is thus obtained which is shown in FIGS. 1, 2A, and 2B.

Second Embodiment

Figure 9:
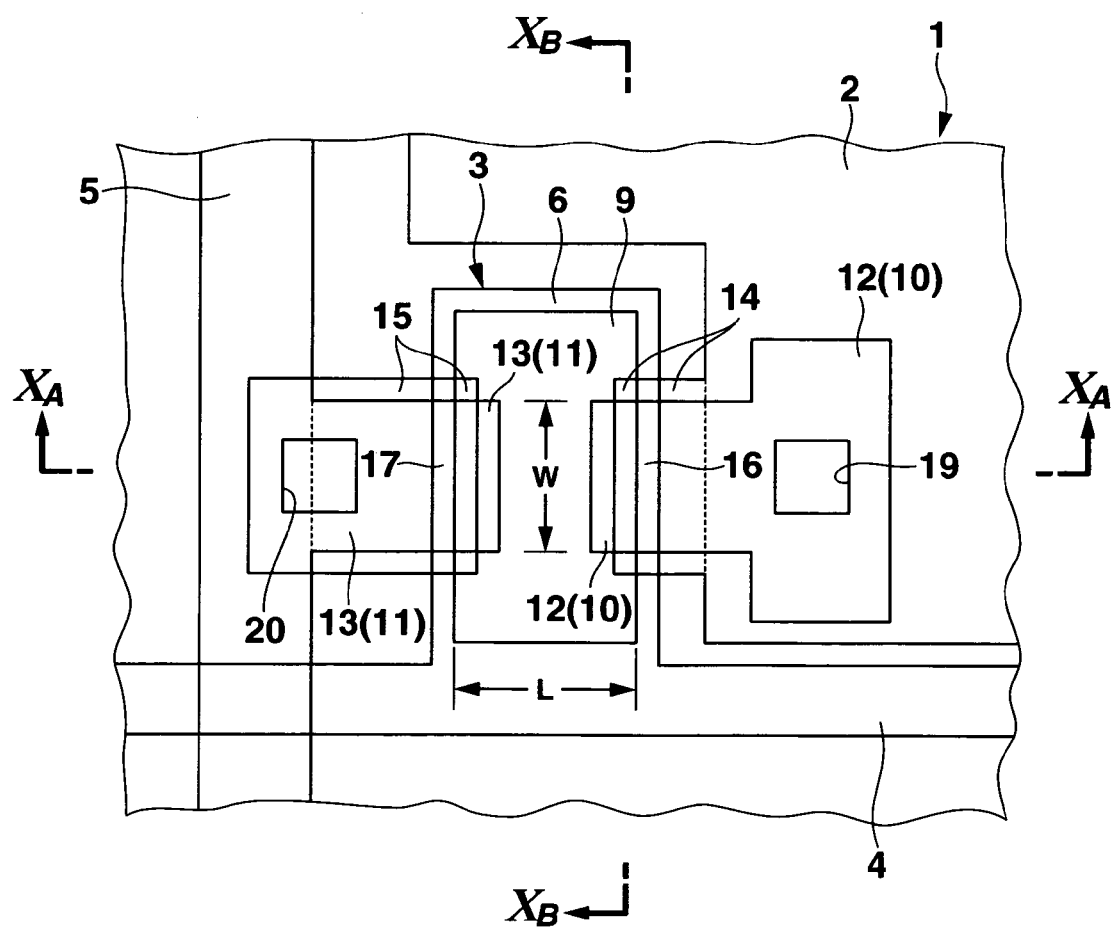
FIG. 9 is a perspective plan view of a part of a thin-film transistor panel according to a second embodiment of the present invention.
Figure 10A:
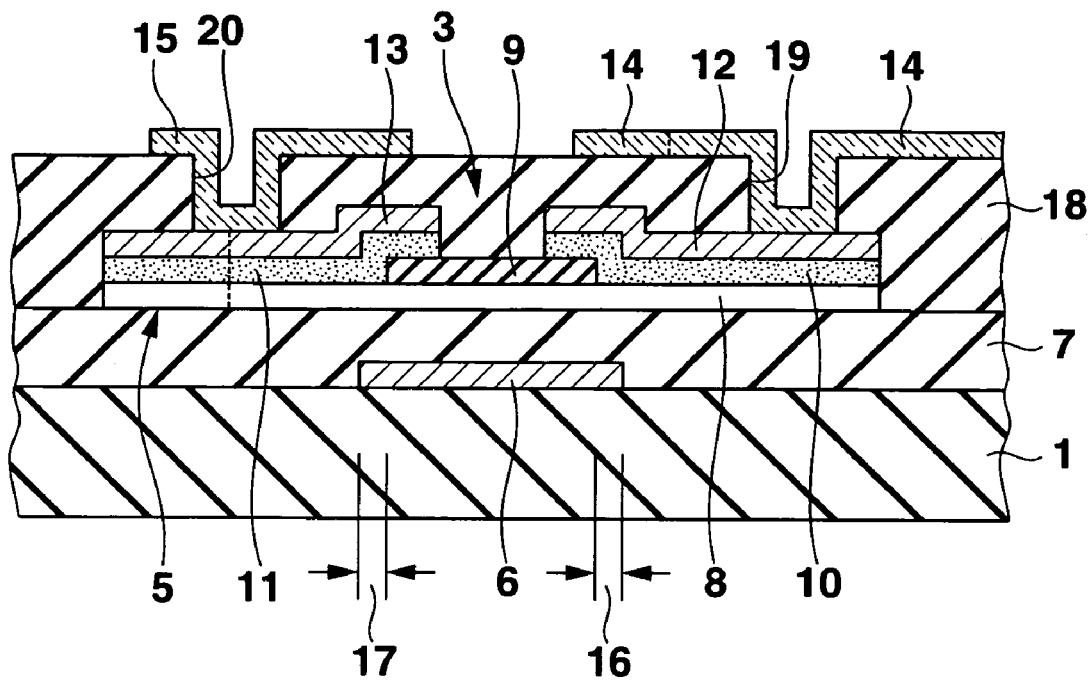
FIGS. 10A and 10B are a sectional view taken along line $X_A$-$X_A$ in FIG. 9 and a sectional view taken along line $X_B$-$X_B$ in FIG. 9, respectively.

FIG. 9 is a perspective plan view of a part of a thin-film transistor panel according to a second embodiment of the present invention. FIG. 10A is a sectional view taken along line $X_A$-$X_A$ in FIG. 9.

Figure 10B:
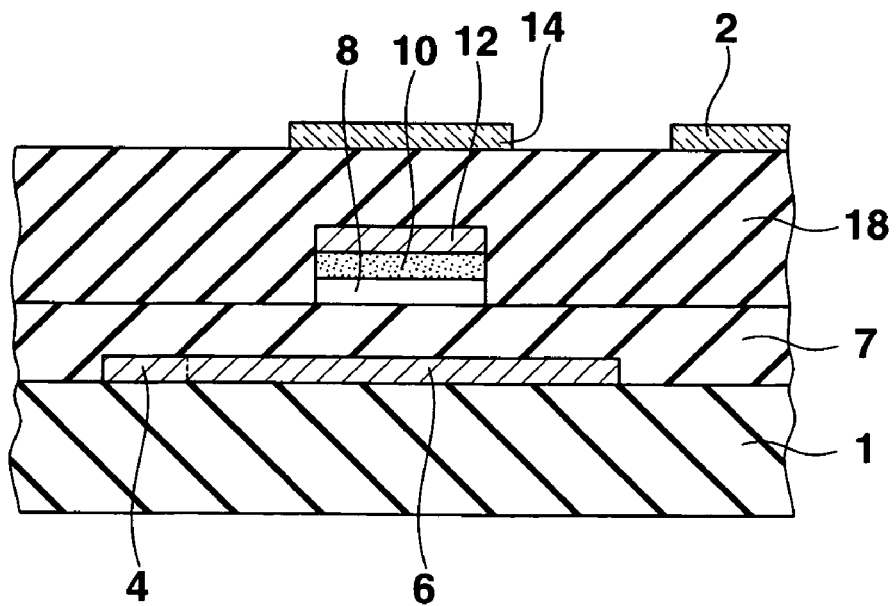

FIG. 10B is a sectional view taken along line $X_B$-$X_B$ in FIG. 9. For clarity, FIG. 9 omits overcoat film 18, which is shown in FIGS. 10A and 10B. Dashed lines are used in the drawings to indicate virtual boundaries between elements. The thin film transistor panel according to the second embodiment is different from the thin-film transistor panel according to the first embodiment as shown in FIGS. 1, 2A, and 2B in that the pixel electrode 2 and conductive coating film 14 are provided on the top surface of the overcoat film 18 and electrically connected to the source electrode 12 via a contact hole 19 formed through the overcoat film 18, and in that the conductive coating film 15 is provided on the top surface of the overcoat film 18 and connected to the drain electrode 13 via a contact hole 20 formed through the overcoat film 18.

Third Embodiment

Figure 11:
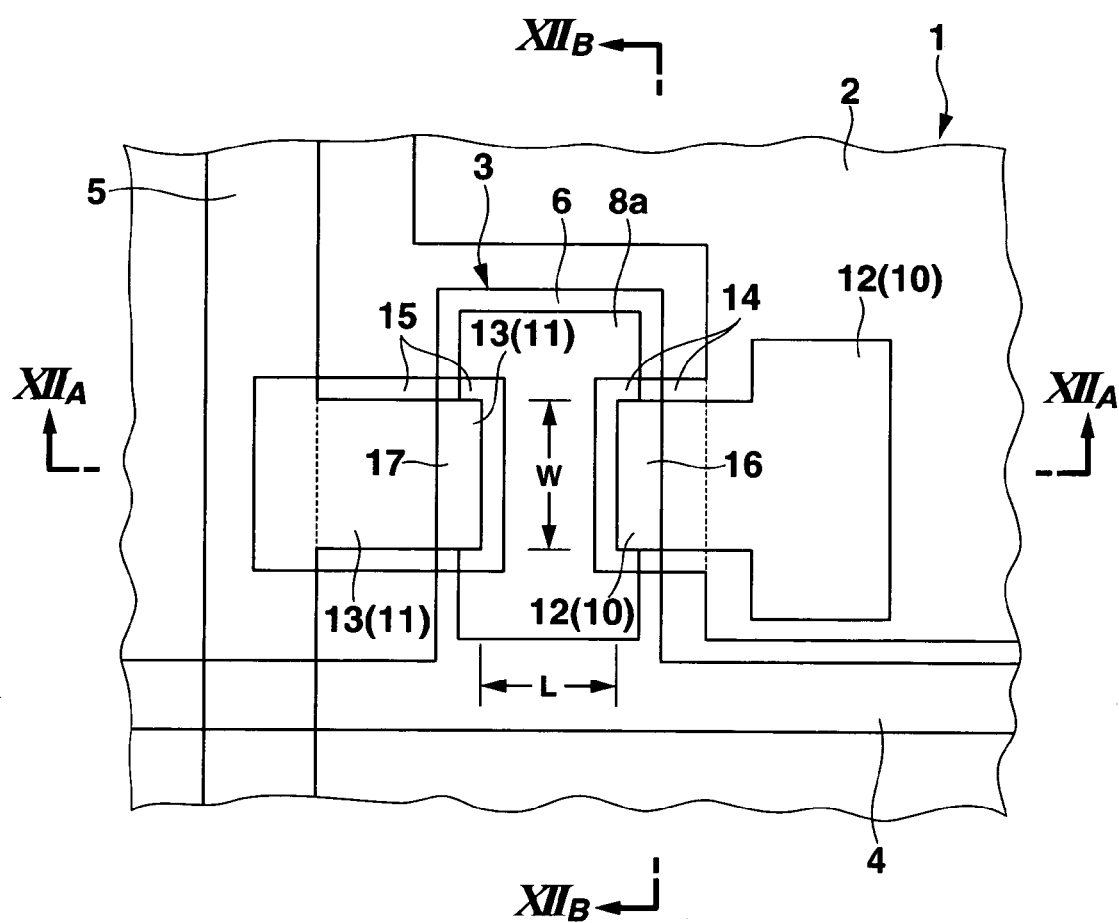
FIG. 11 is a perspective plan view of a part of a thin-film transistor panel according to a third embodiment of the present invention.
Figure 12A:
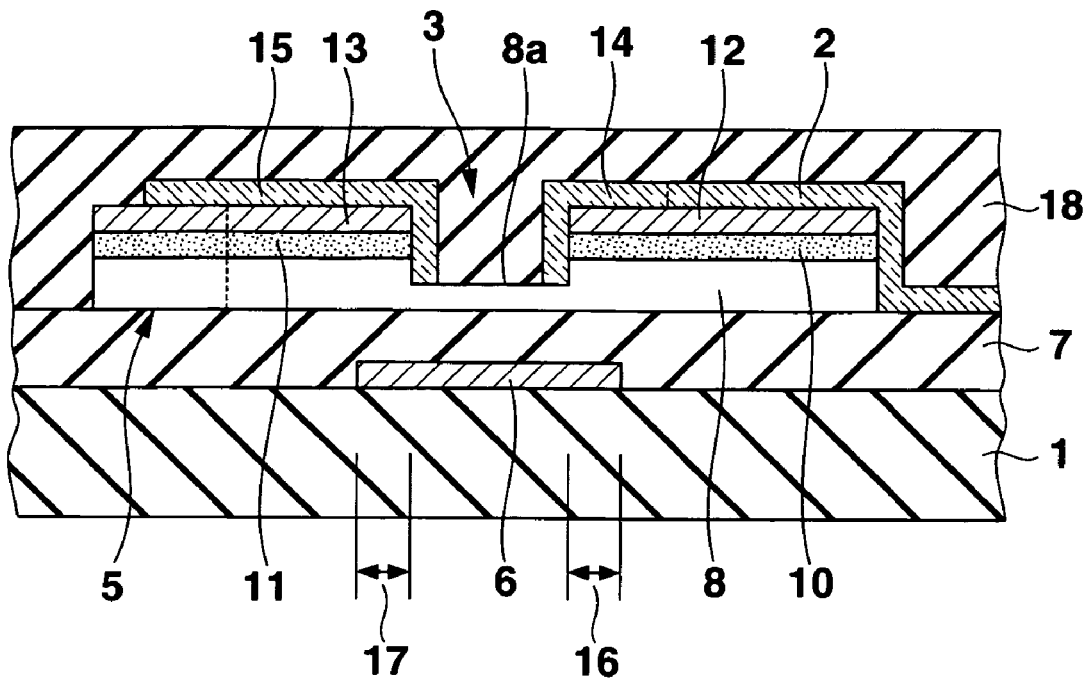
FIGS. 12A and 12B are a sectional view taken along line $XII_A$-$XII_A$ in FIG. 11 and a sectional view taken along line $XII_B$-$XII_B$ in FIG. 11, respectively.
Figure 12B:
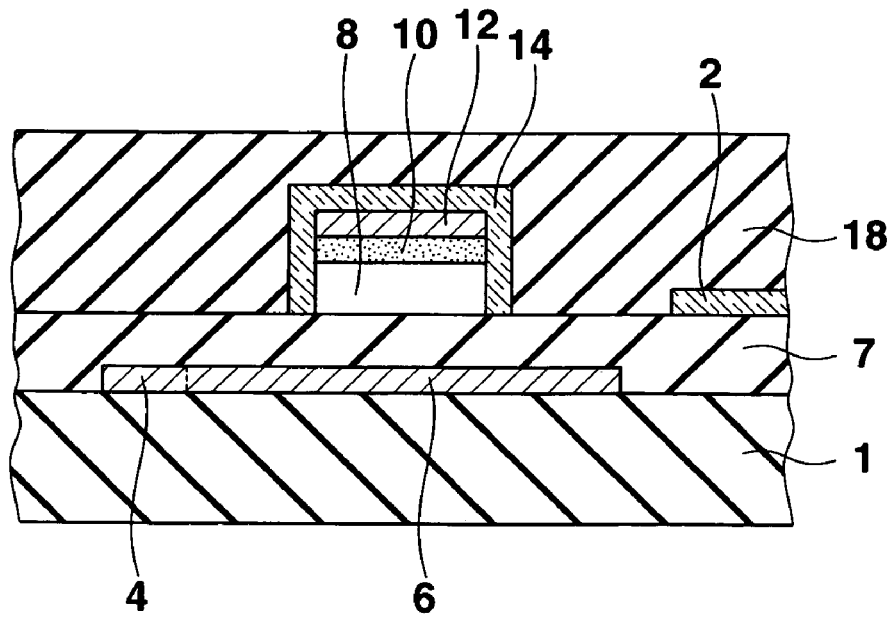

FIG. 11 is a perspective plan view of a part of a thin-film transistor panel according to a third embodiment of the present invention. FIG. 12A is a sectional view taken along line $XII_A$-$XII_A$ in FIG. 11. FIG. 12B is a sectional view taken along line $XII_B$-$XII_B$ in FIG. 11. For clarity, FIG. 11 omits overcoat film 18, which is shown in FIGS. 12A and 12B. Dashed lines are used in the drawings to indicate virtual boundaries between elements. This thin film transistor panel is different from that shown in FIGS. 1, 2A, and 2B in that the thin-film transistor 3 is of a channel etch type.

Specifically, the thin-film transistor 3 in the thin-film transistor panel according to the third embodiment does not comprise the channel protective film 9. The thin-film transistor 3 according to the third embodiment has a recess 8a in the top surface of the semiconductor thin film 8, and the recess 8a is not formed in areas under the pair of ohmic contact layers 10 and 11. The semiconductor thin film 8 is relatively thick and is composed of an almost cross-shaped plane in a predetermined area of the top surface of the gate insulating film 7.

In this thin-film transistor 3, the ohmic contact areas 16 and 17 extend up to the end surfaces of the source electrode 12 and drain electrode 13, respectively, which are closer to the gate electrode 6. Accordingly, the end surfaces of the source electrode 12 and the drain electrode 13 are covered with the conductive coating films 14 and 15. Since the thin-film transistor 3 according to the third embodiment is a channel etch type thin-film transistor, the channel length L can be reduced to some degree compared to the channel length in the first embodiment.

Now, an exemplary method for manufacturing the thin-film transistor panel according to the third embodiment will be described. First, a relatively thick intrinsic amorphous silicon film is deposited on a top surface of a gate insulating film 7. The intrinsic amorphous silicon film is patterned by a photolithography process to form the relatively thick semiconductor thin films 8 as almost cross-shaped planes. An n-type amorphous silicon film and a metal film are consecutively deposited on the top surface of the gate insulating film 7 and the semiconductor thin films 8. These deposited films are sequentially patterned by a photolithography process to form source electrodes 12, drain electrodes 13, and a plurality of pairs of ohmic contact layers 10 and 11. In this case, a recess 8a is formed, by overetching, in the top surface of the semiconductor thin film 8 in the areas that are not under the pair of ohmic contact layers 10 and 11.

Then, an ITO film is deposited on the top surfaces of the gate insulating film 7, source electrodes 12 and drain electrodes 13. The ITO film is then patterned by a photolithography process to form pixel electrodes 2 and pairs of conductive coating films 14 and 15. This also avoids an increase in the number of photolithography steps. This method requires a dedicated photolithography step of forming a semiconductor thin film 8. However, it eliminates a photolithography step of forming a channel protective film, generally avoiding an increase in the number of photolithography steps.

Fourth Embodiment

Figure 13:
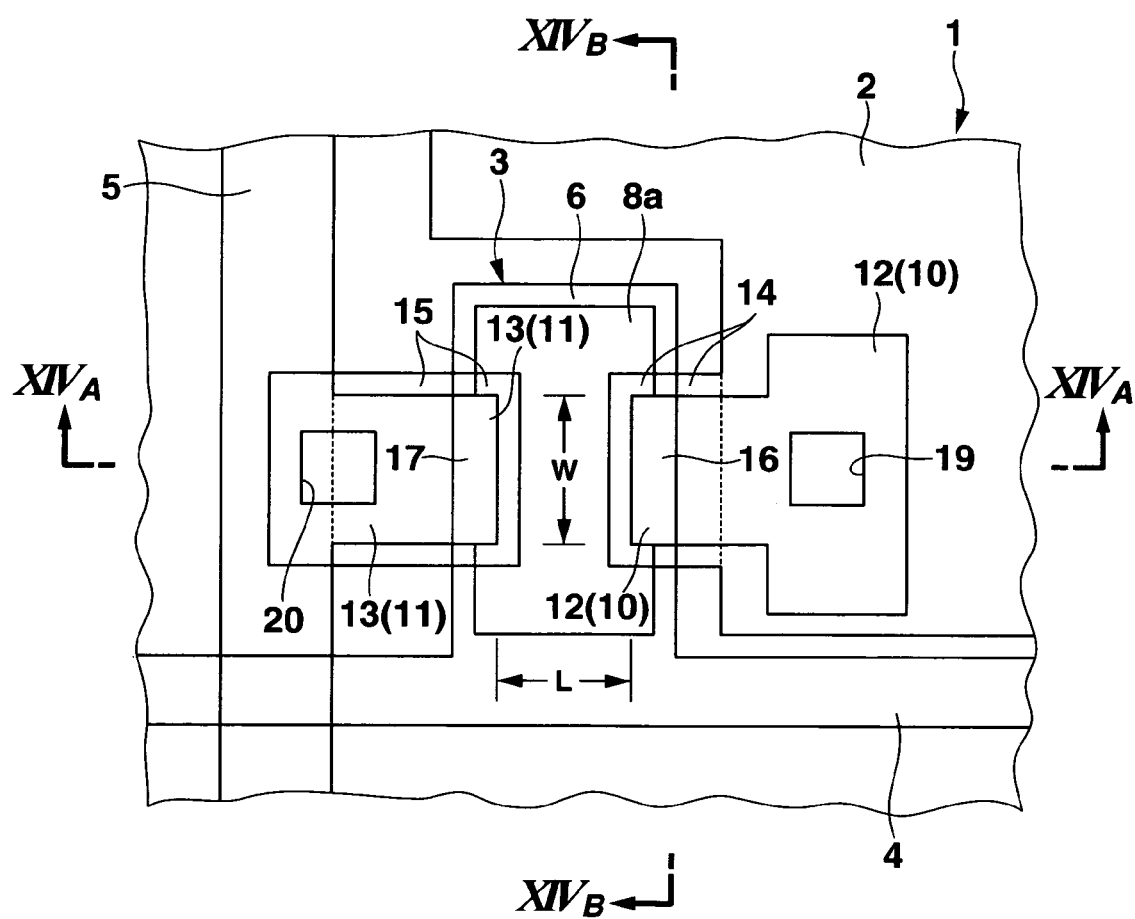
FIG. 13 is a perspective plan view of a part of a thin-film transistor panel according to a fourth embodiment of the present invention.
Figure 14A:
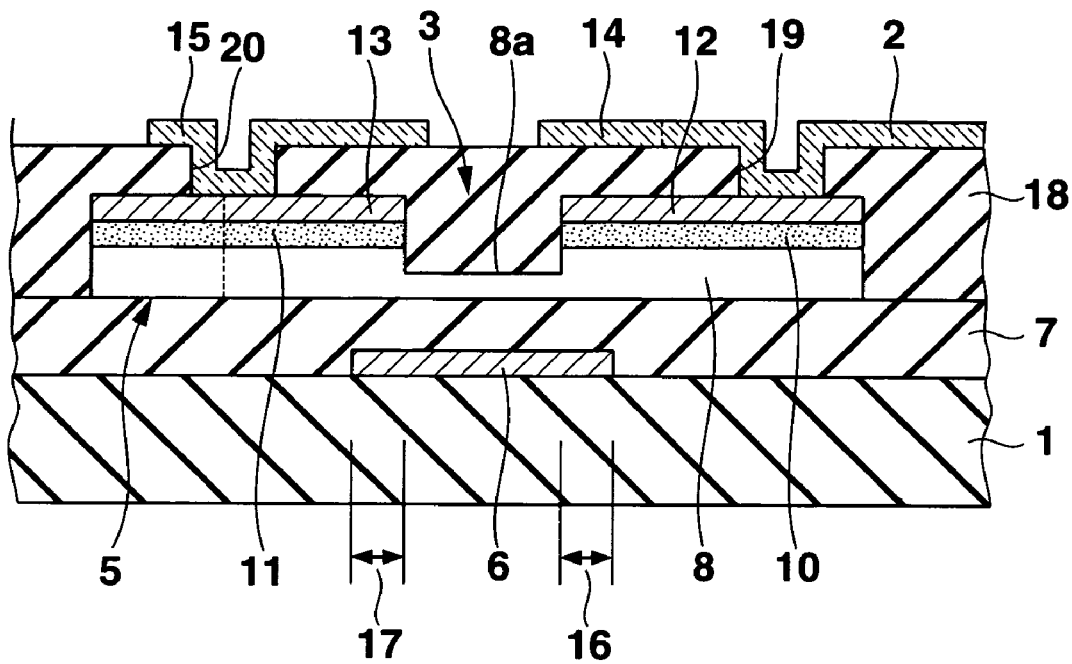
FIGS. 14A and 14B are a sectional view taken along line $XIV_A$-$XIV_A$ in FIG. 13 and a sectional view taken along line $XIV_B$-$XIV_B$ in FIG. 13, respectively.
Figure 14B:
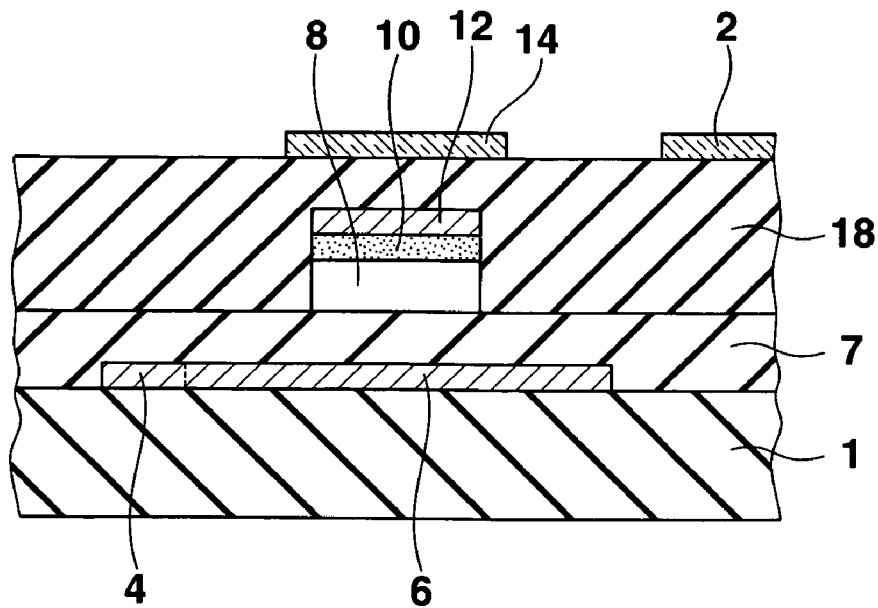

FIG. 13 is a perspective plan view of a part of a thin-film transistor panel according to a fourth embodiment of the present invention. FIG. 14A is a sectional view taken along line $XIV_A$-$XIV_A$ in FIG. 13. FIG. 14B is a sectional view taken along line $XIV_B$-$XIV_B$ in FIG. 13. For clarity, FIG. 13 omits overcoat film 18, which is shown in FIGS. 14A and 14B. Dashed lines are used in the drawings to indicate virtual boundaries between elements. The thin-film transistor panel according to the fourth embodiment is different from the thin-film transistor panel according to the third embodiment as shown in FIGS. 11, 12A, and 12B in that the pixel electrode 2 and conductive coating film 14 are provided on the top surface of the overcoat film 18 so as to connect to the source electrode 12 via the contact hole 19 formed in the overcoat film 18, and in that the conductive coating film 15 is provided on the top surface of the overcoat film 18 so as to connect to the drain electrode 13 via the contact hole 20 formed in the overcoat film 18.

Fifth Embodiment

Figure 15:
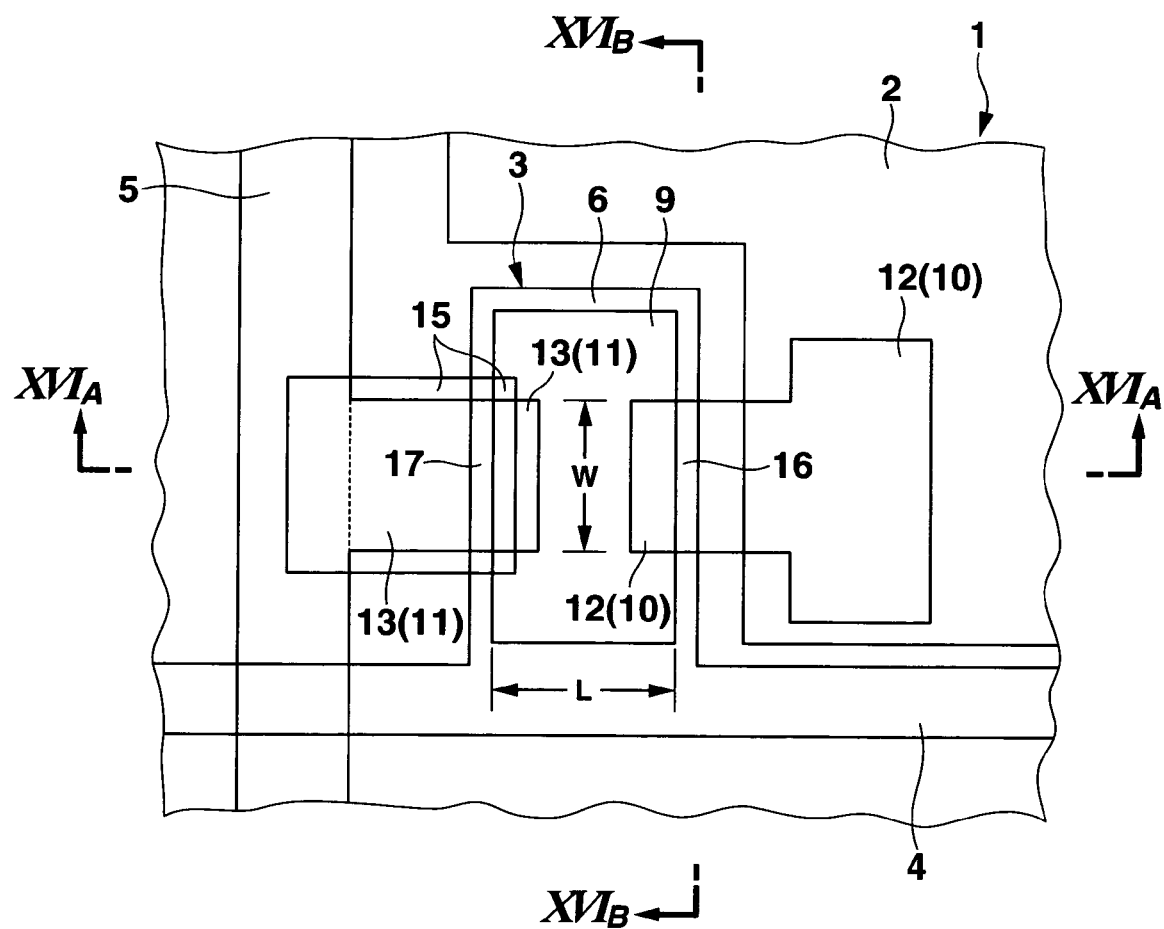
FIG. 15 is a perspective plan view of a part of a thin-film transistor panel according to a fifth embodiment of the present invention.
Figure 16A:
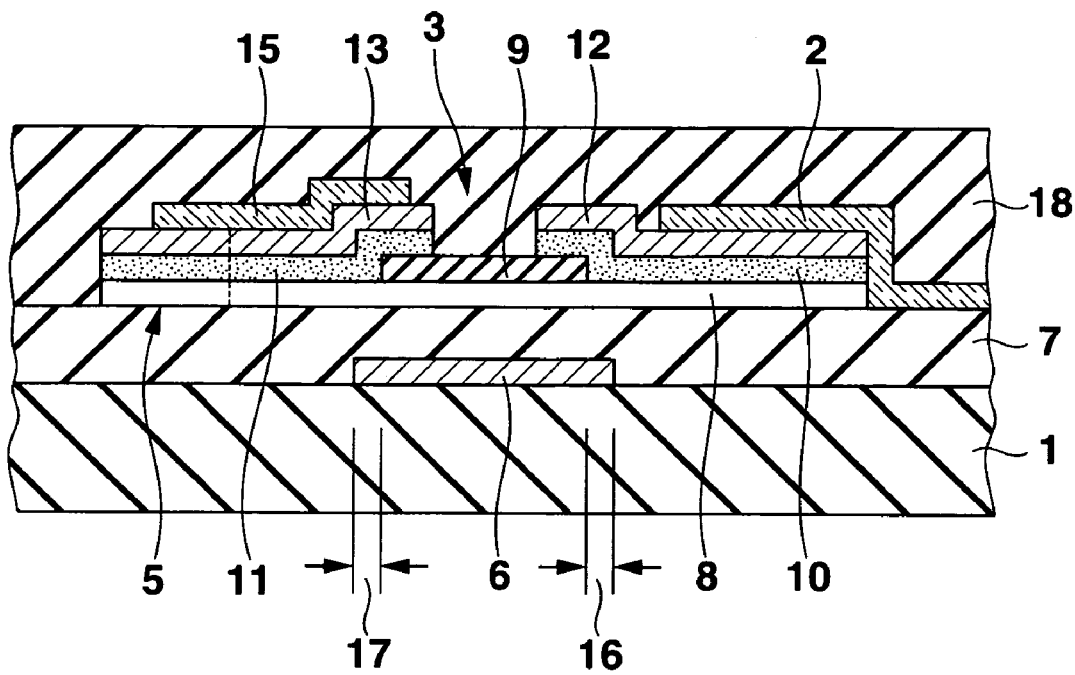
FIGS. 16A and 16B are a sectional view taken along line $XVI_A$-$XVI_A$ in FIG. 15 and a sectional view taken along line $XVI_B$-$XVI_B$ in FIG. 15, respectively.
Figure 16B:
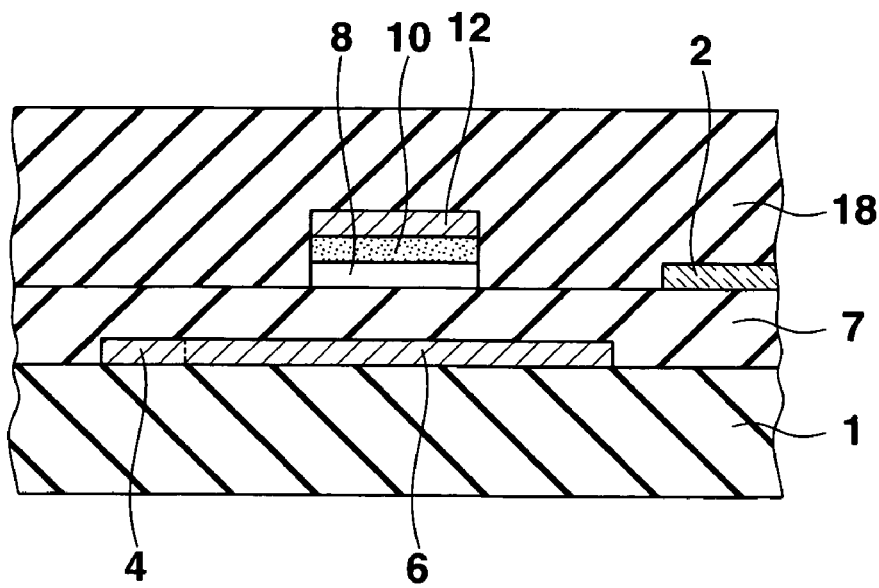

FIG. 15 is a perspective plan view of a part of a thin-film transistor panel according to a fifth embodiment of the present invention. FIG. 16A is a sectional view taken along line $XVI_A$-$XVI_A$ in FIG. 15. FIG. 16B is a sectional view taken along line $XVI_B$-$XVI_B$ in FIG. 15. For clarity, FIG. 15 omits overcoat film 18, which is shown in FIGS. 16A and 16B. Dashed lines are used in the drawings to indicate virtual boundaries between elements. The thin-film transistor panel according to the fifth embodiment is different from the thin-film transistor panel according to the first embodiment as shown in FIGS. 1, 2A, and 2B in that the conductive coating film 14 is omitted.

In addition, in the configuration shown in FIGS. 1, 2A, and 2B, the conductive coating film 15 may be omitted. Further, in the configuration shown in FIGS. 9, 10A, and 10B, either of the paired conductive coating films 14 and 15 may be omitted. Furthermore, in the configuration shown in FIGS. 11, 12A, and 12B, either of the paired conductive coating films 14 and 15 may be omitted. Moreover, in the configuration shown in FIGS. 13, 14A, and 14B, either of the paired conductive coating films 14 and 15 may be omitted.

Sixth Embodiment

Figure 17:
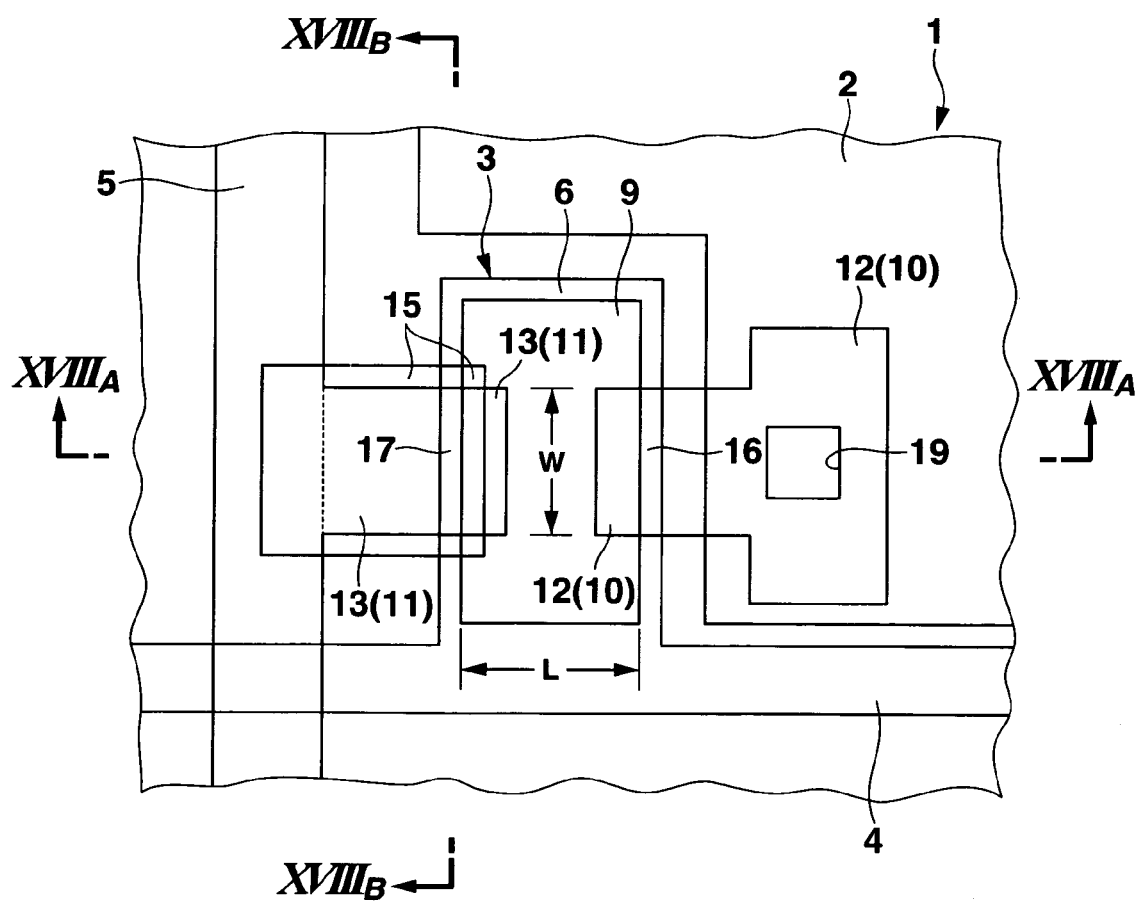
FIG. 17 is a perspective plan view of a part of a thin-film transistor panel according to a sixth embodiment of the present invention.
Figure 18A:
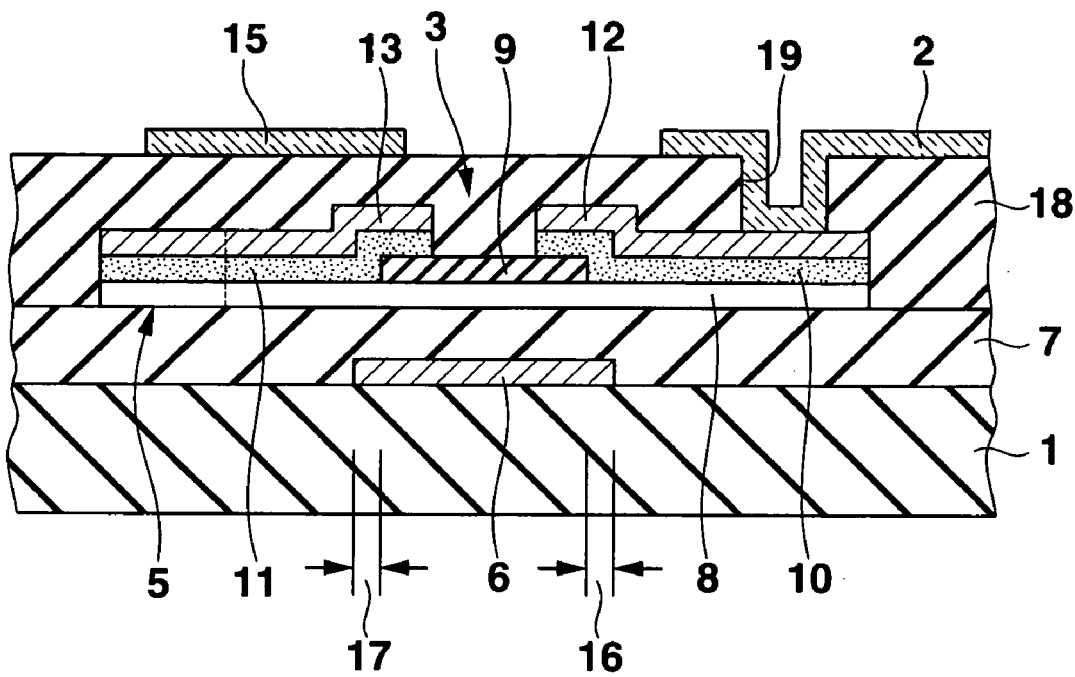
FIGS. 18A and 18B are a sectional view taken along line $XVIII_A$-$XVIII_A$ in FIG. 17 and a sectional view taken along line $XVIII_B$-$XVIII_B$ in FIG. 17, respectively.
Figure 18B:
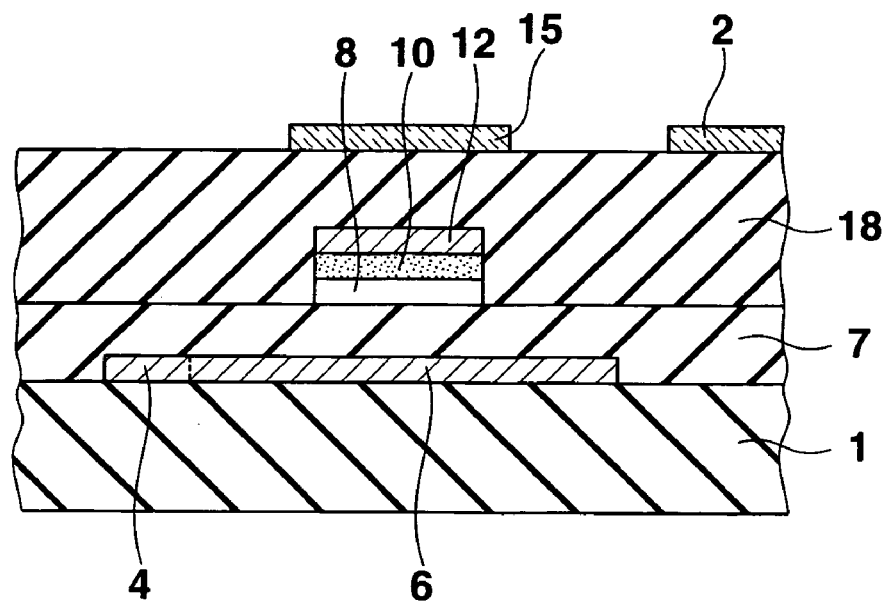

FIG. 17 is a perspective plan view of a part of a thin-film transistor panel according to a sixth embodiment of the present invention. FIG. 18A is a sectional view taken along line $XVIII_A$-$XVIII_A$ in FIG. 17. FIG. 18B is a sectional view taken along line $XVIII_B$-$XVIII_B$ in FIG. 17. For clarity, FIG. 17 omits overcoat film 18, which is shown in FIGS. 18A and 18B. Dashed lines are used in the drawings to indicate virtual boundaries between elements. The thin-film transistor panel according to the sixth embodiment is different from the thin-film transistor panel according to the second embodiment as shown in FIGS. 9, 10A, and 10B in that the conductive coating film 14 is omitted and in that the conductive coating film 15 is formed on the top surface of the overcoat film 18 like an island without connecting to the drain electrode 13. In other words, if the layout does not allow a contact hole 20 to be easily formed in the overcoat film 18 on the drain electrode 13, the conductive coating film 15 may be formed on the top surface of the overcoat film 18 like an island without electrically connecting to the drain electrode.

In this case, the conductive coating film 15 is shaped like an island and electrically insulated from the drain electrode 13. However, capacitive coupling forms a vertical electric field in an area in which the conductive coating film 15 lies opposite the drain electrode 13 via the overcoat film 18. Capacitive coupling also forms a vertical electric field in an area in which the conductive coating film 15 lies opposite the gate electrode 6 via the overcoat film 18 and gate insulating film 7.

Additional advantages and modifications will readily occur to those skilled in the art. Therefore, the invention in its broader aspects is not limited to the specific details and representative embodiments shown and described herein. Accordingly, various modifications maybe made without departing from the spirit or scope of the general inventive concept as defined by the appended claims and their equivalents.

What is claimed is:

1. A thin-film transistor panel comprising:
a substrate;
at least one thin-film transistor which is formed on the substrate, and which includes: a gate electrode, a gate insulating film, a semiconductor thin film, first and second ohmic contact layers formed on the semiconductor thin film, and source and drain electrodes which are respectively formed on the first and second ohmic contact layers, wherein the semiconductor thin film includes a channel area between the source electrode and the drain electrode;
at least one pixel electrode connected to the source electrode of the thin-film transistor;
a first conductive coating film which is provided over and electrically connected to the source electrode, wherein the first conductive coating film overlaps the first ohmic contact layer, and wherein the first conductive coating film is formed of the same material as the pixel electrode; and
a second conductive coating film which is provided over and electrically connected to the drain electrode, wherein the second conductive coating film overlaps the second ohmic contact layer, and wherein the second conductive coating film is formed of the same material as the pixel electrode;
wherein the first conductive coating film is wider than the source electrode, and the second conductive coating film is wider than the drain electrode.

2. The thin-film transistor panel according to claim 1, wherein the first conductive coating film entirely covers a part of the source electrode which is outside the channel area.

3. The thin-film transistor panel according to claim 1, wherein the second conductive coating film entirely covers a part of the drain electrode which is outside the channel area.

4. The thin-film transistor panel according to claim 1, wherein the first conductive coating film is provided in contact with a top surface of the source electrode and formed contiguously to and integrally with the pixel electrode.

5. The thin-film transistor panel according to claim 1, wherein the first conductive coating film is provided in contact with: a top surface of the source electrode, opposite sides of the source electrode across a width of the source electrode, and opposite sides of the ohmic contact layer across a width of the ohmic contact layer.

6. The thin-film transistor panel according to claim 1, wherein the second conductive coating film is provided in contact with a top surface of the drain electrode and extends from the drain electrode over a part of drain wiring connected to the drain electrode.

7. The thin-film transistor panel according to claim 6, wherein the second conductive coating film is provided in contact with: the top surface of the drain electrode, opposite sides of the drain electrode across a width of the drain electrode, and opposite sides of the contact layer across a width of the contact layer.

8. The thin-film transistor panel according to claim 1, further comprising an overcoat film which covers the thin film transistor, wherein the pixel electrode and the first and second conductive coating films are provided on the overcoat film.

9. The thin-film transistor panel according to claim 8, wherein the first conductive coating film is provided contiguously to the pixel electrode on a part of a top surface of the overcoat film which lies on the source electrode, and the first conductive coating film is connected to the source electrode via a contact hole formed through the overcoat film.

10. The thin-film transistor panel according to claim 8, wherein the second conductive coating film is provided on a part of a top surface of the overcoat film which lies on the drain electrode.

11. The thin-film transistor panel according to claim 8, wherein the second conductive coating film is connected to the drain electrode via a contact hole formed through the overcoat film.

12. The thin-film transistor panel according to claim 1, wherein one end side edge of the source electrode which is opposite the drain electrode is not covered with the first conductive coating film.

13. The thin-film transistor panel according to claim 1, wherein one end side edge of the drain electrode which is opposite the source electrode is not covered with the second conductive coating film.

14. The thin-film transistor panel according to claim 1, wherein end surfaces of the source electrode and first ohmic contact layer which are opposite the drain electrode are covered with the first conductive coating film.

15. The thin-film transistor panel according to claim 1, wherein end surfaces of the drain electrode and second ohmic contact layer which are opposite the source electrode are covered with the second conductive coating film.

16. The thin-film transistor panel according to claim 1, wherein the thin film transistor includes a channel protective film, and the first conductive coating film overlaps a portion of a region in which the first ohmic contact layer overlaps the channel protective film.

17. The thin-film transistor panel according to claim 1, wherein the thin film transistor includes a channel protective film, and the second conductive coating film overlaps a portion of a region in which the second ohmic contact layer overlaps the channel protective film.

18. The thin-film transistor panel according to claim 1, wherein the thin film transistor includes a channel protective film, and a planar shape of a region in which the source electrode overlaps the channel protective film is equal to a planar shape of a region in which the first ohmic contact layer overlaps the channel protective film.

19. The thin-film transistor panel according to claim 1, wherein the thin film transistor includes a channel protective film, and a planar shape of a region in which the drain electrode overlaps the channel protective film is equal to a planar shape of a region in which the second ohmic contact layer overlaps the channel protective film.

20. The thin-film transistor panel according to claim 1, wherein a planar shape of a region in which the source electrode overlaps the gate electrode is equal to a planar shape of a region in which the first ohmic contact layer overlaps the gate electrode.

21. The thin-film transistor panel according to claim 1, wherein a planar shape of a region in which the drain electrode overlaps the gate electrode is equal to a planar shape of a region in which the second ohmic contact layer overlaps the gate electrode.

22. The thin-film transistor panel according to claim 1, wherein the first conductive coating film overlaps a portion of a region in which the first ohmic contact layer overlaps the gate electrode.

23. The thin-film transistor panel according to claim 1, wherein the second conductive coating film overlaps a portion of a region in which the second ohmic contact layer overlaps the gate electrode.

24. The thin-film transistor panel according to claim 1, wherein the first conductive coating film overlaps a portion of a region in which the first ohmic contact layer overlaps the semiconductor thin film.

25. The thin-film transistor panel according to claim 1, wherein the second conductive coating film overlaps a portion of a region in which the second ohmic contact layer overlaps the semiconductor thin film.

26. A thin-film transistor panel comprising:
   a substrate;
   at least one thin-film transistor which is formed on the substrate, and which includes: a gate electrode, a gate insulating film, a semiconductor thin film, a channel protective film, and source and drain electrodes which are formed on the semiconductor thin film, wherein the semiconductor thin film includes a channel region between the source electrode and the drain electrode;
   at least one pixel electrode connected to the source electrode of the thin-film transistor; and
   a first conductive coating film which is provided over the source electrode, wherein the first conductive coating film overlaps a portion of a region in which the source electrode overlaps the channel protective film, wherein the first conductive coating film is formed of the same material as the pixel electrode, and wherein the first conductive coating film is wider than the source electrode; and
   a second conductive coating film which is provided over the drain electrode, wherein the second conductive coating film overlaps a portion of a region in which the drain electrode overlaps the channel protective film, wherein the second conductive coating film is formed of the same material as the pixel electrode, and wherein the second conductive coating film is wider than the drain electrode.

27. The thin-film transistor panel according to claim 26, wherein the first and second conductive coating films are electrically insulated from the source and drain electrodes, respectively.

* * * * *